(12) United States Patent
Murasaki

(10) Patent No.: US 11,101,345 B2
(45) Date of Patent: Aug. 24, 2021

(54) SEMICONDUCTOR DEVICE

(71) Applicant: ROHM CO., LTD., Kyoto (JP)

(72) Inventor: Kohei Murasaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 134 days.

(21) Appl. No.: 16/494,699

(22) PCT Filed: May 2, 2018

(86) PCT No.: PCT/JP2018/017570
§ 371 (c)(1),
(2) Date: Sep. 16, 2019

(87) PCT Pub. No.: WO2018/207712
PCT Pub. Date: Nov. 15, 2018

(65) Prior Publication Data
US 2020/0091282 A1  Mar. 19, 2020

(30) Foreign Application Priority Data

May 8, 2017 (JP) .............................. JP2017-092423

(51) Int. Cl.
*H01L 29/06* (2006.01)
*H01L 29/10* (2006.01)
(Continued)

(52) U.S. Cl.
CPC ...... *H01L 29/0619* (2013.01); *H01L 29/1095* (2013.01); *H01L 29/4236* (2013.01); *H01L 29/78* (2013.01); *H01L 29/868* (2013.01)

(58) Field of Classification Search
CPC ............. H01L 29/0619; H01L 29/1095; H01L 29/4236; H01L 29/78; H01L 29/868;
(Continued)

(56) References Cited

U.S. PATENT DOCUMENTS

2015/0303294 A1*  10/2015  Sakata ................ H01L 29/0696
                                                        257/330
2017/0018636 A1*  1/2017  Naito .................. H01L 29/0649
(Continued)

FOREIGN PATENT DOCUMENTS

JP        S61137368 A      6/1986
JP        2003158258 A     5/2003
(Continued)

OTHER PUBLICATIONS

Patent Cooperation Treaty: International Search Report and Written Opinion of PCT/JP2018/017570; dated Feb. 5, 2018; 8pages.
(Continued)

*Primary Examiner* — Victor A Mandala
(74) *Attorney, Agent, or Firm* — Gregory M. Howison

(57) ABSTRACT

A semiconductor device includes a semiconductor layer that has a main surface and that includes an active region, a first-conductivity-type first impurity region formed at a surface layer portion of the main surface of the semiconductor layer, a second-conductivity-type field limit region formed along a peripheral edge of the active region in a surface layer portion of the first impurity region, and a second-conductivity-type low concentration region that has a second-conductivity-type impurity concentration lower than a second-conductivity-type impurity concentration of the field limit region and that is formed along a peripheral edge of the field limit region in a region on a side opposite to the active region with respect to the field limit region in the surface layer portion of the first impurity region.

22 Claims, 16 Drawing Sheets

(51) Int. Cl.
  *H01L 29/423* (2006.01)
  *H01L 29/78* (2006.01)
  *H01L 29/868* (2006.01)

(58) Field of Classification Search
  CPC ......... H01L 29/66712; H01L 29/66734; H01L 29/7811; H01L 29/7813; H01L 29/8611; H01L 29/0638; H01L 29/404; H01L 29/0615; H01L 29/0696; H01L 29/7802; H01L 29/0834; H01L 29/7395; H01L 29/66333; H01L 29/66348; H01L 29/7397; H01L 29/739
  See application file for complete search history.

(56) References Cited

U.S. PATENT DOCUMENTS

2017/0077217 A1* 3/2017 Ogawa ................ H01L 29/0615
2017/0179109 A1* 6/2017 Toyoda ............... H01L 29/8611
2018/0040688 A1* 2/2018 Kobayashi .......... H01L 29/0878
2018/0130874 A1* 5/2018 Takaoka .............. H01L 29/0634
2019/0288062 A1* 9/2019 Takaoka .............. H01L 29/0649
2020/0091283 A1* 3/2020 Matsushita ......... H01L 29/8611
2020/0161457 A1* 5/2020 Takahashi ............ H01L 29/423

FOREIGN PATENT DOCUMENTS

| JP | 2011243999 A | 12/2011 |
| JP | 2013038329 A | 2/2013 |
| WO | 2004066392 A1 | 8/2004 |
| WO | 20130037851 A1 | 2/2013 |

OTHER PUBLICATIONS

PCT: International Preliminary Report on Patentability of PCT/JP2018/017570; dated Nov. 21, 2019; 15 pages.

* cited by examiner

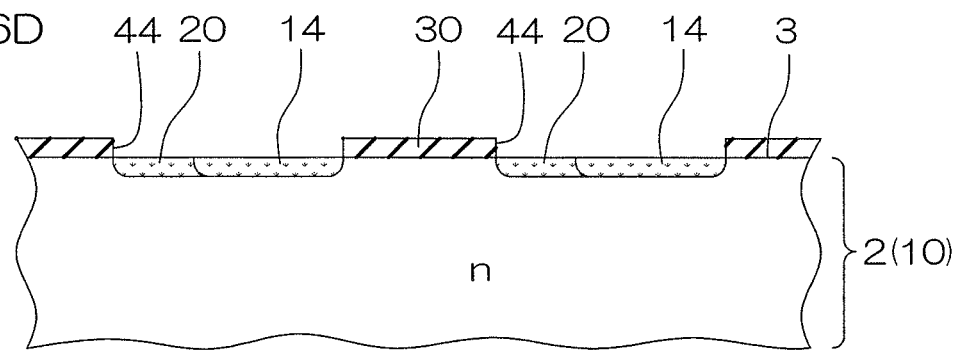
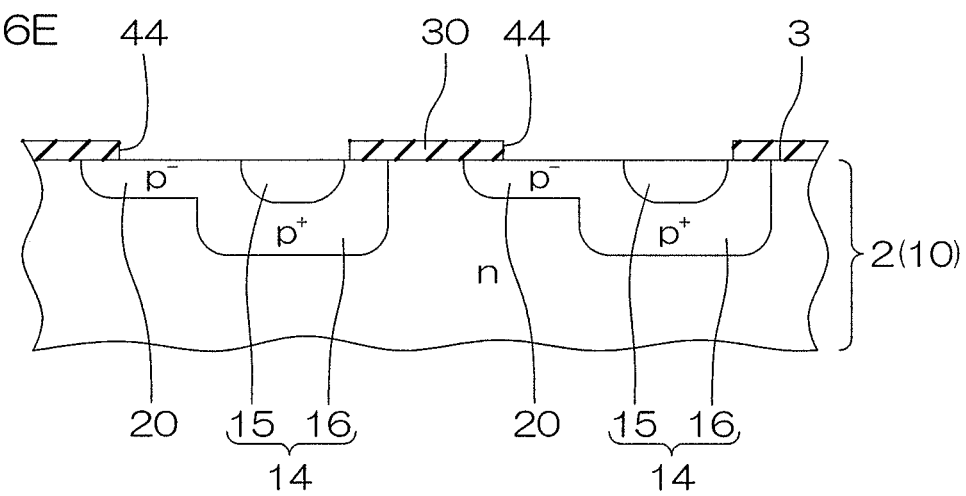
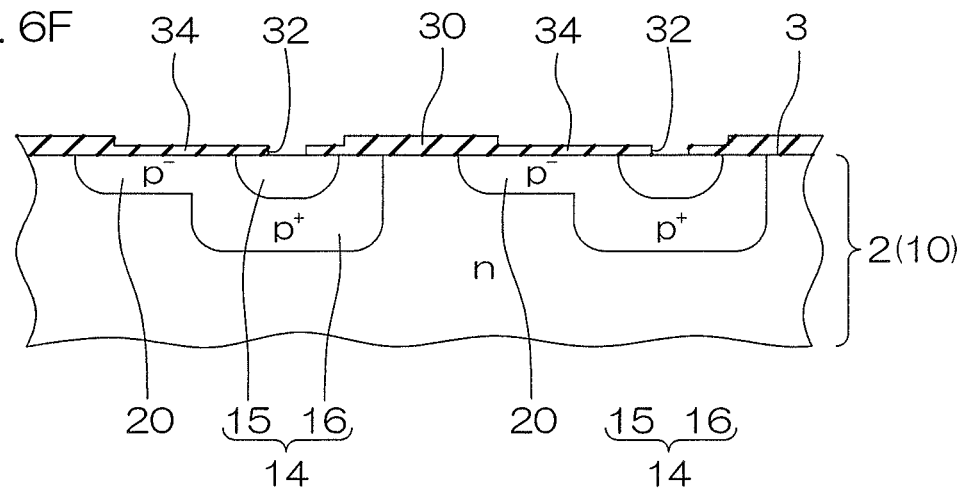

SEMICONDUCTOR DEVICE

CROSS-REFERENCE TO RELATED APPLICATIONS

This application is a U.S. National Phase application submitted under 35 U.S.C. § 371 of Patent Cooperation Treaty application serial no. PCT/JP2018/017570, filed May 2, 2018, and entitled SEMICONDUCTOR DEVICE, which application claims priority to Japanese patent application serial no. 2017-092423, filed May 8, 2017, and entitled 半導体装置.

Patent Cooperation Treaty application serial no. PCT/JP2018/017570, published as WO2018/207712 A1, and Japanese Patent Application serial no. 2017-092423, are incorporated herein by reference.

TECHNICAL FIELD

The present invention relates to a semiconductor device.

BACKGROUND ART

Patent Literature 1 discloses a semiconductor device that has a field limit region. This semiconductor device includes an n type semiconductor layer. An active region is formed at a surface layer portion of the semiconductor layer. A p type field limit region is formed in a region around the active region in the surface layer portion of the semiconductor layer.

A depletion layer spreading from the active region is further expanded outwardly from the active region by the depletion layer spreading from the field limit region. As a result, the withstand voltage of the semiconductor device is improved.

CITATION LIST

Patent Literature

Patent Literature 1: Japanese Patent Application Publication No. 2003-158258

SUMMARY OF THE INVENTION

Technical Problem

The present inventors have diligently studied the structure of the field limit region, and, as a result, have ascertained that there is a possibility that the semiconductor layer may be broken due to an electric field concentration to the field limit region.

The field limit region has a structure in which a depletion layer spreading from the field limit region overlaps with a depletion layer spreading from the active region. Therefore, there is a case in which a region where an electric field strength cannot be appropriately relaxed is generated in the field limit region depending on an aspect in which those depletion layers overlap with each other. The semiconductor layer leads to be breakdown due to the electric field concentration generated in that region.

A preferred embodiment of the present invention provides a semiconductor device that is capable of preventing electric field concentration from occurring in a field limit region and that enables a semiconductor layer to improve breakdown tolerance.

Solution to the Problem

A preferred embodiment of the present invention provides a semiconductor device including a semiconductor layer that has a main surface and that includes an active region, a first-conductivity-type first impurity region formed at a surface layer portion of the main surface of the semiconductor layer, a second-conductivity-type field limit region formed along a peripheral edge of the active region in a surface layer portion of the first impurity region, and a second-conductivity-type low concentration region that has a second-conductivity-type impurity concentration lower than a second-conductivity-type impurity concentration of the field limit region and that is formed along a peripheral edge of the field limit region in a region on a side opposite to the active region with respect to the field limit region in the surface layer portion of the first impurity region.

According to this semiconductor device, it is possible to expand the depletion layer from the field limit region. It is also possible to expand the depletion layer from the low concentration region. The second-conductivity-type impurity concentration of the low concentration region is lower than the second-conductivity-type impurity concentration of the field limit region. Therefore, the depletion layer spreading from the low concentration region becomes larger than the depletion layer spreading from the field limit region.

This makes it possible to expand the depletion layer spreading from the field limit region in a direction opposite to the active region. As a result, it is possible to restrain electric field concentration to the limit region, hence making it possible to improve the breakdown tolerance of the semiconductor layer.

The aforementioned or still other objects, features, and effects of the present invention will be clarified by the following description of preferred embodiments given below with reference to the accompanying drawings.

BRIEF DESCRIPTION OF THE DRAWINGS

FIG. 6D is a cross-sectional view showing a step subsequent to that of FIG. 6C.

FIG. 6E is a cross-sectional view showing a step subsequent to that of FIG. 6D.

FIG. 6F is a cross-sectional view showing a step subsequent to that of FIG. 6E.

DESCRIPTION OF THE EMBODIMENTS

Figure 1:
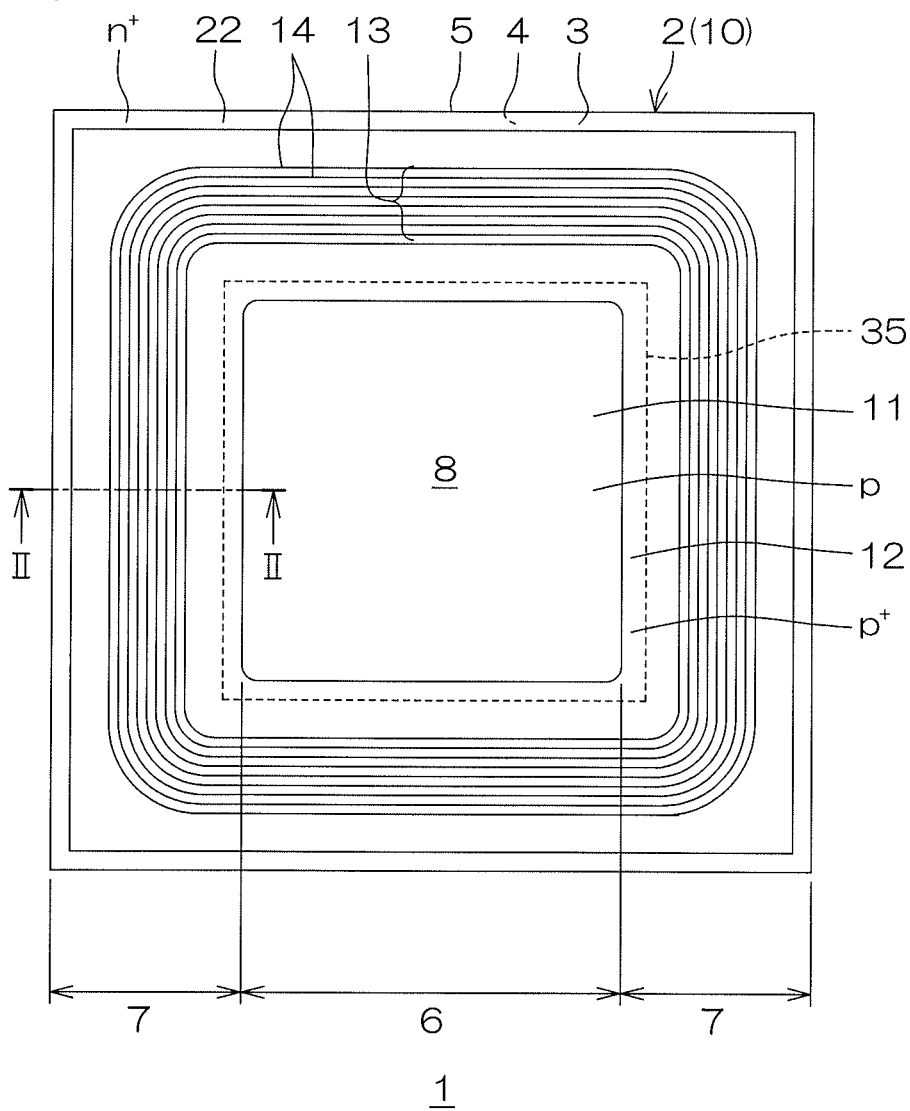
FIG. 1 is a plan view showing a semiconductor device according to a first preferred embodiment of the present invention.

FIG. 1 is a plan view showing a semiconductor device 1 according to a first preferred embodiment of the present invention.

Referring to FIG. 1, the semiconductor device 1 includes a semiconductor layer 2. The semiconductor layer 2 includes a first main surface 3 on one side, a second main surface 4 on the other side, and a lateral surface 5 by which the first main surface 3 and the second main surface 4 are connected together.

The semiconductor layer 2 is formed in a quadrangular shape in plan view as viewed from a normal direction of the first main surface 3 (hereinafter, referred to simply as "in plan view"). The length of the single lateral surface 5 of the semiconductor layer 2 may be not less than 1 mm and not more than 20 mm in plan view. The thickness of the semiconductor layer 2 may be not less than 50 μm and not more than 200 μm.

An active region 6 and an outer region 7 are set in the semiconductor layer 2. The active region 6 is a region in which a functional device 8 is formed. The active region 6 is also called an device forming region. A diode, a MISFET (Metal Insulator Semiconductor Field Effect Transistor), an IGBT (Insulated Gate Bipolar Transistor), etc. can be exemplified as the functional device 8.

The active region 6 may be set at a central portion of the semiconductor layer 2 in plan view. The active region 6 may be set in an inner region of the semiconductor layer 2 with an interval from the lateral surface 5 of the semiconductor layer 2 in plan view. The active region 6 may be set in a quadrangular shape that has four sides parallel to the lateral surface 5 of the semiconductor layer 2 in plan view.

The outer region 7 is set in a region outside the active region 6. The outer region 7 may be set in an endless shape (quadrangular ring shape) that surrounds the active region 6 in plan view.

Figure 2:
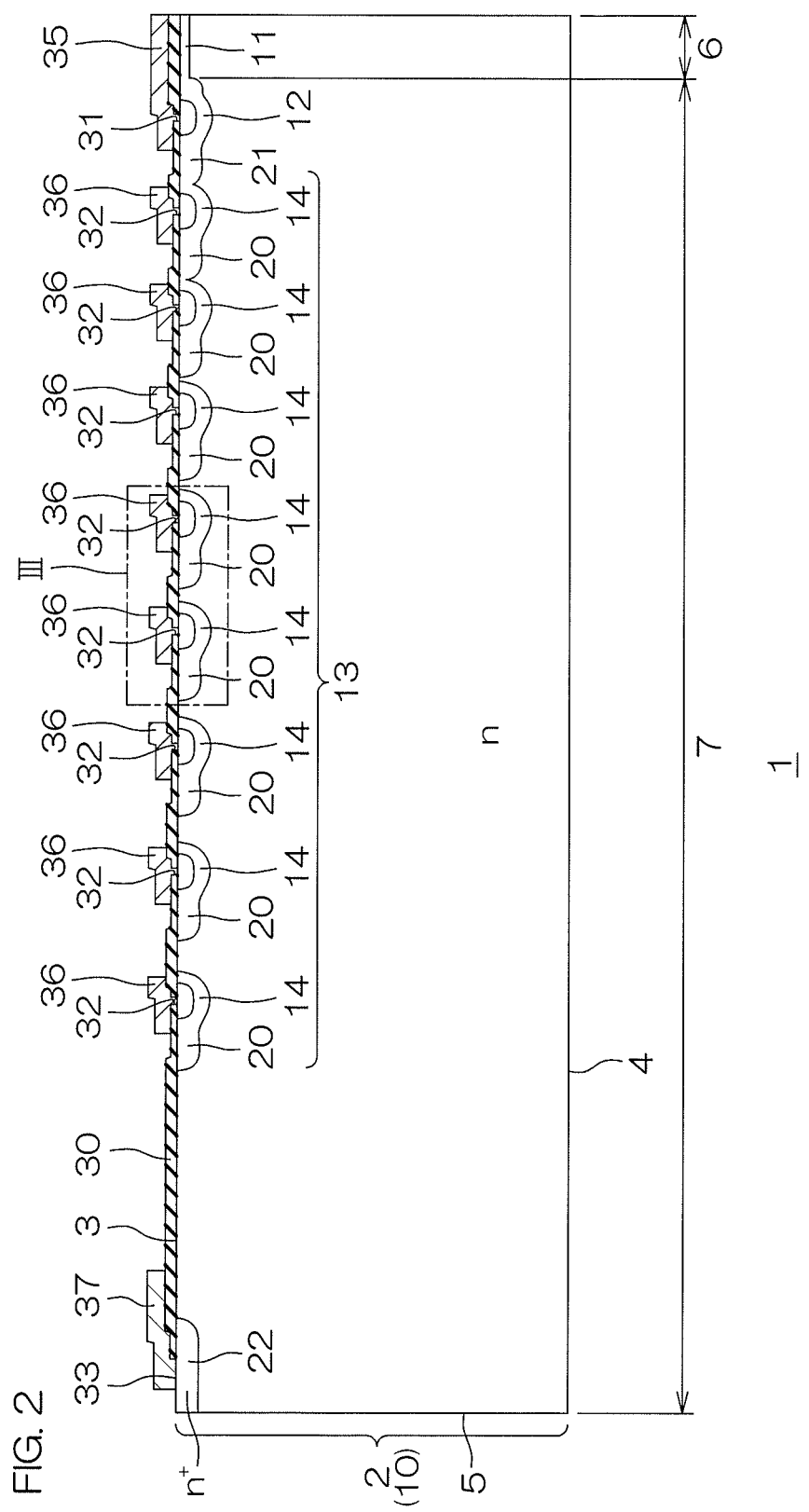
FIG. 2 is a cross-sectional view taken along line II-II in FIG. 1.
Figure 3:
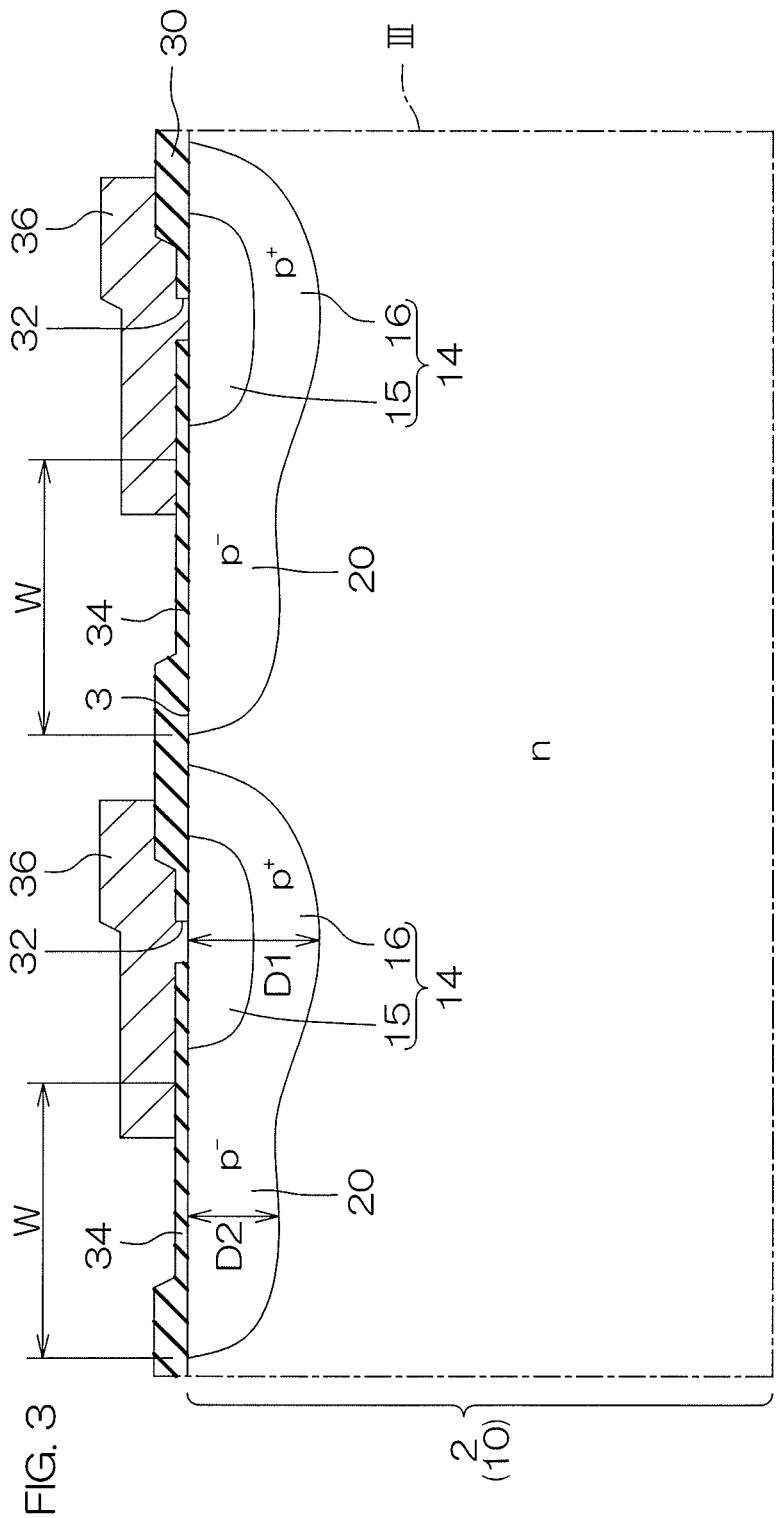
FIG. 3 is an enlarged view of region III of FIG. 2.

FIG. 2 is a cross-sectional view taken along line II-II in FIG. 1. FIG. 3 is an enlarged view of region III of FIG. 2. Reference is hereinafter made to FIG. 1 if necessary.

Referring to FIG. 2, an n type impurity region 10 is formed in the semiconductor layer 2. The n type impurity region 10 is formed in substantially the whole area of a region ranging from a surface layer portion of the first main surface 3 of the semiconductor layer 2 to a surface layer portion of the second main surface 4. In other words, the semiconductor layer 2 is formed such that it can be regarded as an n type semiconductor layer. The semiconductor layer 2 may be a silicon-made n type FZ substrate that is formed according to an FZ (Floating Zone) method.

An n type impurity region and/or a p type impurity region may be formed at the surface layer portion of the second main surface 4 of the semiconductor layer 2. The conductivity type of the impurity region formed at the surface layer portion of the second main surface 4 of the semiconductor layer 2 is selected in accordance with the kind of the functional device 8 formed in the active region 6.

A p type impurity region 11 is formed at the surface layer portion of the first main surface 3 of the semiconductor layer 2 in the active region 6 (also see FIG. 1). The p type impurity region 11 is formed at the central portion of the semiconductor layer 2 in plan view. The p type impurity region 11 is formed in the inner region of the semiconductor layer 2 with an interval from a peripheral edge of the semiconductor layer 2 in plan view.

The p type impurity region 11 is formed in a quadrangular shape that has four sides parallel to the lateral surface 5 of the semiconductor layer 2 in plan view. The p type impurity region 11 makes a pn junction portion between the p type impurity region 11 and the n type impurity region 10. The p type impurity region 11 defines the active region 6.

A $p^+$ type main junction region 12 is formed at the surface layer portion of the first main surface 3 of the semiconductor layer 2 in the outer region 7 (also see FIG. 1). In the present preferred embodiment, the $p^+$ type main junction region 12 has a p type impurity concentration higher than a p type impurity concentration of the p type impurity region 11.

The $p^+$ type main junction region 12 is formed in a belt shape extending along a peripheral edge of the p type impurity region 11 in plan view. In the present preferred embodiment, the $p^+$ type main junction region 12 is formed in an endless shape (quadrangular ring shape) that surrounds the p type impurity region 11 in plan view. An inner peripheral edge of the $p^+$ type main junction region 12 defines a peripheral edge of the active region 6.

In the present preferred embodiment, the $p^+$ type main junction region 12 includes four linear portions and four corner portions. Each of the four linear portions of the $p^+$ type main junction region 12 linearly extends along the lateral surface 5 of the semiconductor layer 2. Each of the four corner portions of the $p^+$ type main junction region 12 connects two of the four linear portions that intersect each other (orthogonalize each other) together.

A bottom portion of the $p^+$ type main junction region 12 is formed at a position deeper than a bottom portion of the p type impurity region 11 regarding a thickness direction of the semiconductor layer 2. The thickness direction of the semiconductor layer 2 is a direction from the first main surface 3 toward the second main surface 4 of the semiconductor layer 2.

Regarding the thickness direction of the semiconductor layer 2, the depth of the p type impurity region 11 may be not less than 1.0 µm and not more than 4.0 µm. The depth of the p⁺ type main junction region 12 may be greater than the depth of the p type impurity region 11. The depth of the p⁺ type main junction region 12 may be not less than 2.5 µm and not more than 15 µm.

The p⁺ type main junction region 12 is connected to the p type impurity region 11. More specifically, the inner peripheral edge of the p⁺ type main junction region 12 overlaps with a peripheral edge portion of the p type impurity region 11 from below. Hence, the p type impurity region 11 and the p⁺ type main junction region 12 are fixed at the same electric potential.

Referring to FIG. 2 and FIG. 3, a field-limit-region group 13 is formed at the surface layer portion of the first main surface 3 of the semiconductor layer 2 in the outer region 7 (also see FIG. 1). The field-limit-region group 13 is formed in a region on the side opposite to the active region 6 with respect to the p⁺ type main junction region 12. The field-limit-region group 13 is formed with an interval from the p⁺ type main junction region 12.

The field-limit-region group 13 includes a plurality of (in the present preferred embodiment, eight) p⁺ type field limit regions 14. The p⁺ type field limit region 14 is also called a p⁺ type guard region.

The plurality of p⁺ type field limit regions 14 are formed with intervals in a direction away from the active region 6. Each of the p⁺ type field limit regions 14 is formed in a belt shape extending along the peripheral edge of the p⁺ type main junction region 12 in plan view.

In the present preferred embodiment, each of the p⁺ type field limit regions 14 is formed in an endless shape (quadrangular ring shape) that surrounds the p⁺ type main junction region 12 in plan view. Hence, each of the p⁺ type field limit regions 14 is formed as a p⁺ type field limiting ring region or as a p⁺ type guard ring region.

In the present preferred embodiment, each of the p⁺ type field limit regions 14 includes four linear portions and four corner portions. Each of the four linear portions of each of the p⁺ type field limit regions 14 linearly extends along the lateral surface 5 of the semiconductor layer 2. Each of the four corner portions of each of the p⁺ type field limit regions 14 connects two of the four linear portions that intersect each other (orthogonalize each other) together.

Each of the p⁺ type field limit regions 14 includes a high concentration portion 15 and a low concentration portion 16. The low concentration portion 16 is a portion that has a p type impurity concentration lower than a p type impurity concentration of the high concentration portion 15. Each of the p⁺ type field limit regions 14 has a concentration profile in which the p type impurity concentration gradually decreases from the high concentration portion 15 toward the low concentration portion 16.

The high concentration portion 15 is formed at the surface layer portion of the first main surface 3 of the semiconductor layer 2. The high concentration portion 15 is formed by the ion implantation of a p type impurity. The low concentration portion 16 surrounds the high concentration portion 15 in the surface layer portion of the first main surface 3 of the semiconductor layer 2. The low concentration portion 16 is formed by a p type impurity that has diffused (more specifically, that has thermally diffused) from the high concentration portion 15.

The depth D1 of each of the p⁺ type field limit regions 14 may be not less than 5.0 µm and not more than 15 µm. The dose amount of a p type impurity of each of the p⁺ type field limit regions 14 may be not less than $1.0 \times 10^{13}$ cm⁻² and not more than $1.0 \times 10^{15}$ cm⁻². A bottom portion of each of the p⁺ type field limit regions 14 may be formed at a depth position substantially equal to that of the bottom portion of the p⁺ type main junction region 12 regarding the thickness direction of the semiconductor layer 2.

A p⁻ type low concentration region 20 is formed at the surface layer portion of the first main surface 3 of the semiconductor layer 2 in the outer region 7. The p⁻ type low concentration region 20 has a p type impurity concentration lower than the p type impurity concentration of the p⁺ type main junction region 12. The p⁻ type low concentration region 20 has a p type impurity concentration lower than the p type impurity concentration of the p⁺ type field limit region 14.

The p⁻ type low concentration region 20 is formed in a region on the side opposite to the active region 6 with respect to an arbitrary one of the p⁺ type field limit regions 14. The p⁻ type low concentration region 20 is formed in a belt shape extending along a peripheral edge of an arbitrary one of the p⁺ type field limit regions 14 in plan view. The p⁻ type low concentration region 20 is formed in an endless shape (quadrangular ring shape) that surrounds an arbitrary one of the p⁺ type field limit regions 14 in plan view.

In the present preferred embodiment, the plurality of p⁻ type low concentration regions 20 are formed in one-to-one correspondence with respect to the plurality of p⁺ type field limit regions 14. Each of the p⁻ type low concentration regions 20 is formed in a region on the side opposite to the active region 6 with respect to a corresponding one of the p⁺ type field limit regions 14.

Each of the p⁻ type low concentration regions 20 is formed in a belt shape extending along the peripheral edge of a corresponding one of the p⁺ type field limit regions 14 in plan view. In the present preferred embodiment, each of the p⁻ type low concentration regions 20 is formed in an endless shape (quadrangular ring shape) that surrounds a corresponding one of the p⁺ type field limit regions 14 in plan view.

More specifically, each of the p⁻ type low concentration regions 20 extends along the linear portion of each of the p⁺ type field limit regions 14. Each of the p⁻ type low concentration regions 20 extends along the corner portion of each of the p⁺ type field limit regions 14. Each of the p⁻ type low concentration regions 20 is drawn out from a corresponding one of the p⁺ type field limit regions 14 in a direction opposite to the active region 6.

Each of the p⁻ type low concentration regions 20 includes one end portion positioned on the active-region-6 side and an opposite end portion positioned on the side opposite to the active region 6. The one end portion of each of the p⁻ type low concentration regions 20 may be formed integrally with a corresponding one of the p⁺ type field limit regions 14.

The opposite end portion of each of the p⁻ type low concentration regions 20 is formed with an interval from the p⁺ type field limit region 14 that adjoins a corresponding one of the p⁺ type field limit regions 14. The opposite end portion of each of the p⁻ type low concentration regions 20 may be formed integrally with the p⁺ type field limit region 14 that adjoins a corresponding one of the p⁺ type field limit regions 14.

Preferably, each of the p⁻ type low concentration regions 20 is formed such that its whole area is not depleted. The reason is that, if the whole area of the p⁻ type low concentration region 20 is depleted, there is a possibility that an electric field will concentrate on an edge portion on the side opposite to the active region 6 in a corresponding one of the p⁺ type field limit regions 14.

A bottom portion of each of the p⁻ type low concentration regions 20 may be formed at a depth position substantially equal to that of the bottom portion of a corresponding one of the p⁺ type field limit regions 14 regarding the thickness direction of the semiconductor layer 2. Preferably, the bottom portion of each of the p⁻ type low concentration regions 20 is formed in a region that is shallower than the bottom portion of a corresponding one of the p⁺ type field limit regions 14 from the viewpoint of an electric-field-strength relaxation effect.

The depth D2 of each of the p⁻ type low concentration regions 20 may be equal to or less than the depth D1 (depth D2≤depth D1) of each of the p⁺ type field limit regions 14. The depth D2 of each of the p⁻ type low concentration regions 20 may be not less than 1.0 μm and not more than 15 μm.

The dose amount of the p type impurity of the p⁻ type low concentration region 20 may be equal to or more than $1.0 \times 10^{12}$ cm⁻² and be less than $1.0 \times 10^{13}$ cm⁻². The width W of each of the p⁻ type low concentration regions 20 may be not less than 1.0 μm and not more than 1.0 μm. The width W of each of the p⁻ type low concentration regions 20 is defined by a width along a direction away from the active region 6 in each of the p⁻ type low concentration regions 20.

Preferably, the width W of each of the p⁻ type low concentration regions 20 is set at a comparatively high value from the viewpoint of restraining electric field concentration to the p⁺ type field limit region 14. However, it is necessary to enlarge the area of the outer region 7 when the width W of each of the p⁻ type low concentration regions 20 is expanded.

In this case, the exclusive area of the outer region 7 with respect to the semiconductor layer 2 increases. Therefore, the width W of each of the p⁻ type low concentration regions 20 is required to be set on the basis of the size of the semiconductor layer 2 or on the basis of an electric field strength to be relaxed.

A p⁻ type main junction low-concentration region 21 is formed at the surface layer portion of the first main surface 3 of the semiconductor layer 2 in the outer region 7. The p⁻ type main junction low-concentration region 21 is formed in a region between the p⁺ type main junction region 12 and the field-limit-region group 13.

The p⁻ type main junction low-concentration region 21 has a p type impurity concentration lower than the p type impurity concentration of the p⁺ type main junction region 12. The p⁻ type main junction low-concentration region 21 has a p type impurity concentration lower than the p type impurity concentration of the p⁺ type field limit region 14. The p⁻ type main junction low-concentration region 21 may have a p type impurity concentration equal to the p type impurity concentration of the p⁻ type low concentration region 20.

The p⁻ type main junction low-concentration region 21 is formed in a belt shape extending along the peripheral edge of the p⁺ type main junction region 12 in plan view. In the present preferred embodiment, the p⁻ type main junction low-concentration region 21 is formed in an endless shape (quadrangular ring shape) that surrounds the p⁺ type main junction region 12 in plan view.

The p⁻ type main junction low-concentration region 21 extends along the linear portion of the p⁺ type main junction region 12. The p⁻ type main junction low-concentration region 21 extends along the corner portion of the p⁺ type main junction region 12. The p⁻ type main junction low-concentration region 21 is drawn out from the p⁺ type main junction region 12 in the direction opposite to the active region 6.

The p⁻ type main junction low-concentration region 21 includes one end portion positioned on the active-region-6 side and an opposite end portion positioned on the side opposite to the active region 6. The one end portion of the p⁻ type main junction low-concentration region 21 may be formed integrally with the p⁺ type main junction region 12.

The opposite end portion of the p⁻ type main junction low-concentration region 21 may be formed with an interval from the p⁺ type field limit region 14. The opposite end portion of the p⁻ type main junction low-concentration region 21 may be formed integrally with the p⁺ type field limit region 14.

Preferably, the p⁻ type main junction low-concentration region 21 is formed such that its whole area is not depleted. The reason is that, if the whole area of the p⁻ type main junction low-concentration region 21 is depleted, there is a possibility that an electric field will concentrate on an edge portion on the side opposite to the active region 6 in the p⁺ type main junction region 12.

A bottom portion of the p⁻ type main junction low-concentration region 21 may be formed at a depth position substantially equal to that of the bottom portion of the p⁺ type main junction region 12 regarding the thickness direction of the semiconductor layer 2. Preferably, the bottom portion of the p⁻ type main junction low-concentration region 21 is formed in a region that is shallower than the bottom portion of the p⁺ type main junction region 12 from the viewpoint of an electric-field-strength relaxation effect.

The depth of the p⁻ type main junction low-concentration region 21 may be equal to or less than the depth of the p⁺ type main junction region 12. The depth of the p⁻ type main junction low-concentration region 21 may be not less than 1.0 μm and not more than 10 km.

The dose amount of the p type impurity of the p⁻ type main junction low-concentration region 21 may be equal to or more than $1.0 \times 10^{12}$ cm⁻² and be less than $1.0 \times 10^{13}$ cm⁻². The width of the p⁻ type main junction low-concentration region 21 may be not less than 1.0 μm and not more than 20 μm. The width of the p⁻ type main junction low-concentration region 21 is defined by a width along the direction away from the active region 6.

The dose amount of the p type impurity of the p⁻ type main junction low-concentration region 21 may be set to become equal to the dose amount of the p type impurity of the p⁻ type low concentration region 20. The depth and the width of the p⁻ type main junction low-concentration region 21 may be set to become equal to the depth and the width of the p⁻ type low concentration region 20.

In a structure in which the active region 6 is set at the central portion of the semiconductor layer 2, the electric field strength of a peripheral edge portion of the semiconductor layer 2 becomes smaller than the electric field strength of an inner portion of the semiconductor layer 2. Therefore, the electric field strength to be relaxed in the peripheral edge portion of the semiconductor layer 2 becomes smaller than the electric field strength to be relaxed in the inner portion of the semiconductor layer 2. From this fact, the following mode examples can be employed.

In a first mode example, the plurality of p⁻ type low concentration regions 20 may be formed such that the p type impurity concentration becomes gradually smaller in proportion to a distance receding from the active region 6. In this structure, the p type impurity concentration of the plurality of p⁻ type low concentration regions 20 may become gradually smaller under the condition that the p type impurity concentration of the p⁻ type main junction low-concentration region 21 is a maximum value.

In a second mode example, the plurality of p⁻ type low concentration regions 20 may be formed such that the width W becomes gradually smaller in proportion to a distance receding from the active region 6. In this structure, the width W of the plurality of p⁻ type low concentration regions 20 may become gradually smaller under the condition that the width of the p⁻ type main junction low-concentration region 21 is a maximum value.

In a third mode example, the plurality of p⁻ type low concentration regions 20 may be formed such that the depth D2 becomes gradually smaller in proportion to a distance receding from the active region 6. In this structure, the depth D2 of the plurality of p⁻ type low concentration regions 20 may become gradually smaller under the condition that the depth of the p⁻ type main junction low-concentration region 21 is a maximum value.

In a fourth mode example, the plurality of p⁻ type low concentration regions 20 may be formed such that the width of a depletion layer spreading from each of the p⁻ type low concentration regions 20 becomes gradually smaller in proportion to a distance receding from the active region 6. More specifically, the depletion layer spreading from the p⁻ type low concentration region 20 spreads from a region (pn junction portion) between each of the p⁻ type low concentration regions 20 and the semiconductor layer 2.

In this structure, the width of the depletion layer spreading from each of the p⁻ type low concentration regions 20 may become gradually smaller under the condition that the width of the depletion layer spreading from the p⁻ type main junction low-concentration region 21 is a maximum value. More specifically, the depletion layer spreading from the p⁻ type main junction low-concentration region 21 spreads from a region (pn junction portion) between the p⁻ type main junction low-concentration region 21 and the semiconductor layer 2.

According to the first to fourth mode examples, it is possible to form a plurality of p⁻ type low concentration regions 20 in accordance with an electric field strength to be relaxed. Therefore, it is possible to appropriately relax the electric field strength of the inside of the semiconductor layer 2. Of course, a mode example in which arbitrary two or more of the first to fourth mode examples are combined together may be employed.

In the first, second, third, or fourth mode example or in a mode example in which arbitrary two or more of those mode examples are combined together, the plurality of p⁺ type field limit regions 14 may be formed such that the distances between the p⁺ type field limit regions 14 become gradually larger in a direction away from the active region 6.

In the first, second, third, or fourth mode example or in a mode example in which arbitrary two or more of those mode examples are combined together, the plurality of p⁺ type field limit regions 14 may be formed such that the distances between the p⁺ type field limit regions 14 differ from each other.

In the first, second, third, or fourth mode example or in a mode example in which arbitrary two or more of those mode examples are combined together, the plurality of p⁺ type field limit regions 14 may be formed such that the distances between the p⁺ type field limit regions 14 become equal to each other.

In these cases, the distance between the p⁺ type main junction region 12 and the p⁺ type field limit region 14 placed at an innermost position may be smaller than the distance between the plurality of p⁺ type field limit regions 14.

An n⁺ type channel stop region 22 is formed at the surface layer portion of the first main surface 3 of the semiconductor layer 2 in the outer region 7 (also see FIG. 1). The n⁺ type channel stop region 22 is formed in a region on the side opposite to the active region 6 with respect to the field-limit-region group 13. The n⁺ type channel stop region 22 is formed with an interval from the field-limit-region group 13 on the side opposite to the active region 6.

The n⁺ type channel stop region 22 has an n type impurity concentration higher than an n type impurity concentration of the semiconductor layer 2. The n⁺ type channel stop region 22 restrains the spreading of a depletion layer from the active-region-6 side.

The n⁺ type channel stop region 22 is formed in a belt shape extending along a peripheral edge of the field-limit-region group 13 in plan view. In the present preferred embodiment, the n⁺ type channel stop region 22 is formed in an endless shape (quadrangular ring shape) that surrounds the field-limit-region group 13 in plan view. The n⁺ type channel stop region 22 may be exposed from the lateral surface 5 of the semiconductor layer 2.

An insulating layer 30 is formed on the first main surface 3 of the semiconductor layer 2. The insulating layer 30 selectively covers the active region 6 and the outer region 7.

The insulating layer 30 may be a LOCOS (Local Oxidation of Silicon) film formed by selectively oxidizing the first main surface 3 of the semiconductor layer 2. The insulating layer 30 may have a trench isolation structure in which an insulator is buried in a trench. The insulating layer 30 may include $SiO_2$ or SiN.

A first contact hole 31, a plurality of second contact holes 32, and a third contact hole 33 are formed in the insulating layer 30.

The first contact hole 31 selectively exposes the p⁺ type main junction region 12. The first contact hole 31 may be formed in an endless shape along the p⁺ type main junction region 12.

The plurality of second contact holes 32 selectively expose a corresponding one of the p⁺ type field limit regions 14. Each of the second contact holes 32 may be formed in an endless shape along a corresponding one of the p⁺ type field limit regions 14.

The third contact hole 33 selectively exposes the n⁺ type channel stop region 22. The third contact hole 33 may be formed in an endless shape along the n⁺ type channel stop region 22. The third contact hole 33 may lead to the lateral surface 5 of the semiconductor layer 2.

The first contact hole 31, the second contact hole 32, and the third contact hole 33 are formed in a thin film portion 34 of the insulating layer 30. The thin film portion 34 of the insulating layer 30 is a portion that has a film thickness smaller than the film thickness of other regions in the insulating layer 30.

Referring to FIG. 2, a main electrode 35, a plurality of field electrodes 36, and an equipotential electrode 37 are formed on the insulating layer 30. In FIG. 1, the main electrode 35 is shown by a broken line.

The main electrode 35 is electrically connected to the active region 6. The main electrode 35 is also electrically connected to the p⁺ type main junction region 12 in the first contact hole 31.

The plurality of field electrodes 36 are fixed in an electrically floating state. The plurality of field electrodes 36 are formed in one-to-one correspondence with respect to the plurality of p$^+$ type field limit regions 14.

Each of the field electrodes 36 may be formed in an endless shape along a corresponding one of the p$^+$ type field limit regions 14. Each of the field electrodes 36 is electrically connected to a corresponding one of the p$^+$ type field limit regions 14 in each of the second contact holes 32.

The equipotential electrode 37 is fixed in an electrically floating state. The equipotential electrode 37 may be formed in an endless shape along the n$^+$ type channel stop region 22. In this case, the equipotential electrode 37 is also called an EQR electrode (equipotential ring electrode). The equipotential electrode 37 is electrically connected to the n$^+$ type channel stop region 22 in the third contact hole 33.

Figure 4:
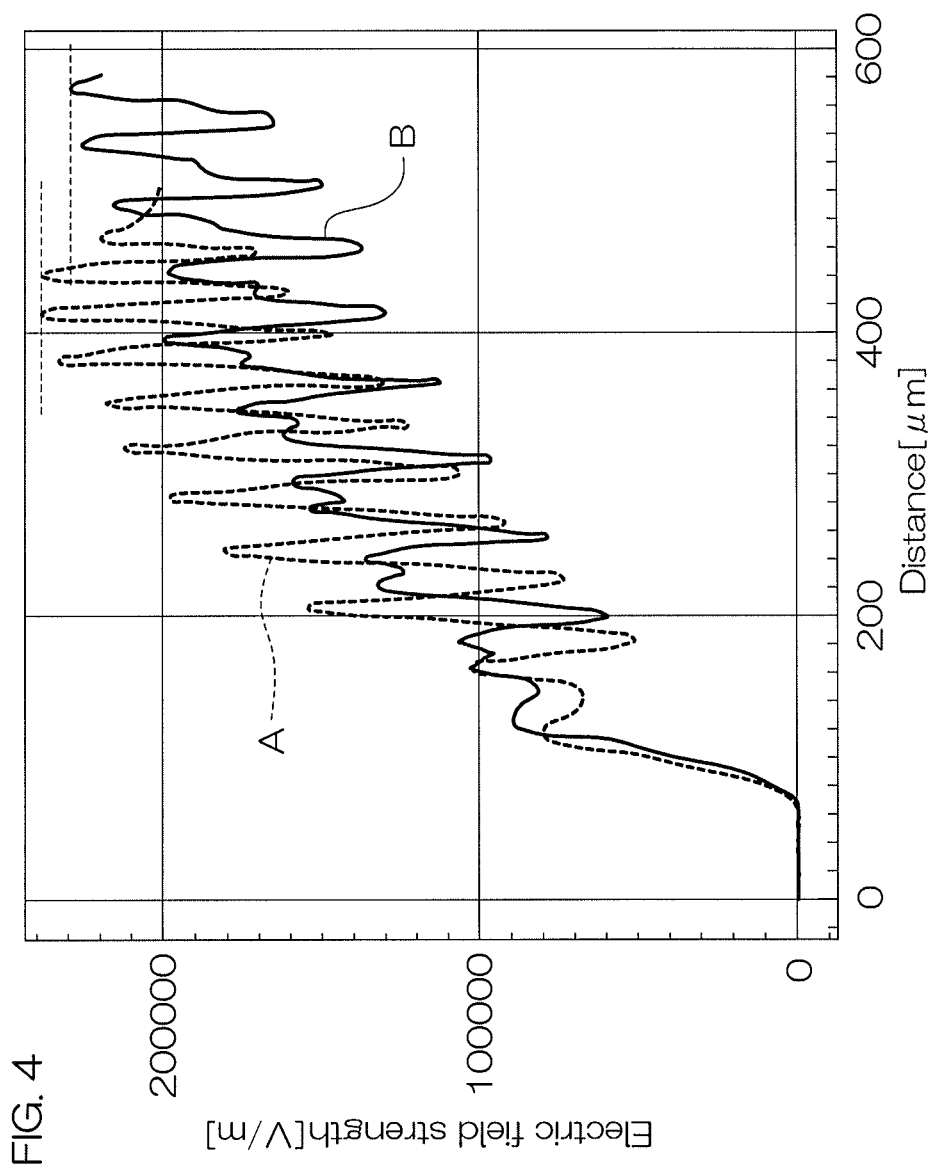
FIG. 4 is a graph showing an electric field strength of the semiconductor device of FIG. 1.

FIG. 4 is a graph showing an electric field strength of the semiconductor device 1 of FIG. 1.

In FIG. 4, the ordinate axis represents an electric field strength [V/m]. In FIG. 4, the abscissa axis represents a distance [μm]. More specifically, the abscissa axis represents a distance from the lateral surface 5 of the semiconductor layer 2 toward the inner region of the semiconductor layer 2 under the condition that the lateral surface 5 of the semiconductor layer 2 is a zero point.

In FIG. 4, a first characteristic A is shown by a broken line, and a second characteristic B is shown by a solid line. Both the first characteristic A and the second characteristic B are calculated by simulations. The first characteristic A is a characteristic shown when all of the p$^-$ type low concentration regions 20 are removed from the semiconductor device 1. The second characteristic B is a characteristic of the semiconductor device 1.

Referring to FIG. 4, it is understood that the peak value of the electric field strength of the second characteristic B is smaller than the peak value of the electric field strength of the first characteristic A. The peak value of the electric field strength of the second characteristic B is about 5% smaller than the peak value of the electric field strength of the first characteristic A.

From the first and second characteristics A and B, it is understood that, according to the semiconductor device 1, the breakdown tolerance of the semiconductor layer 2 has improved because of a decrease in the electric field strength inside the semiconductor layer 2.

Figure 5:
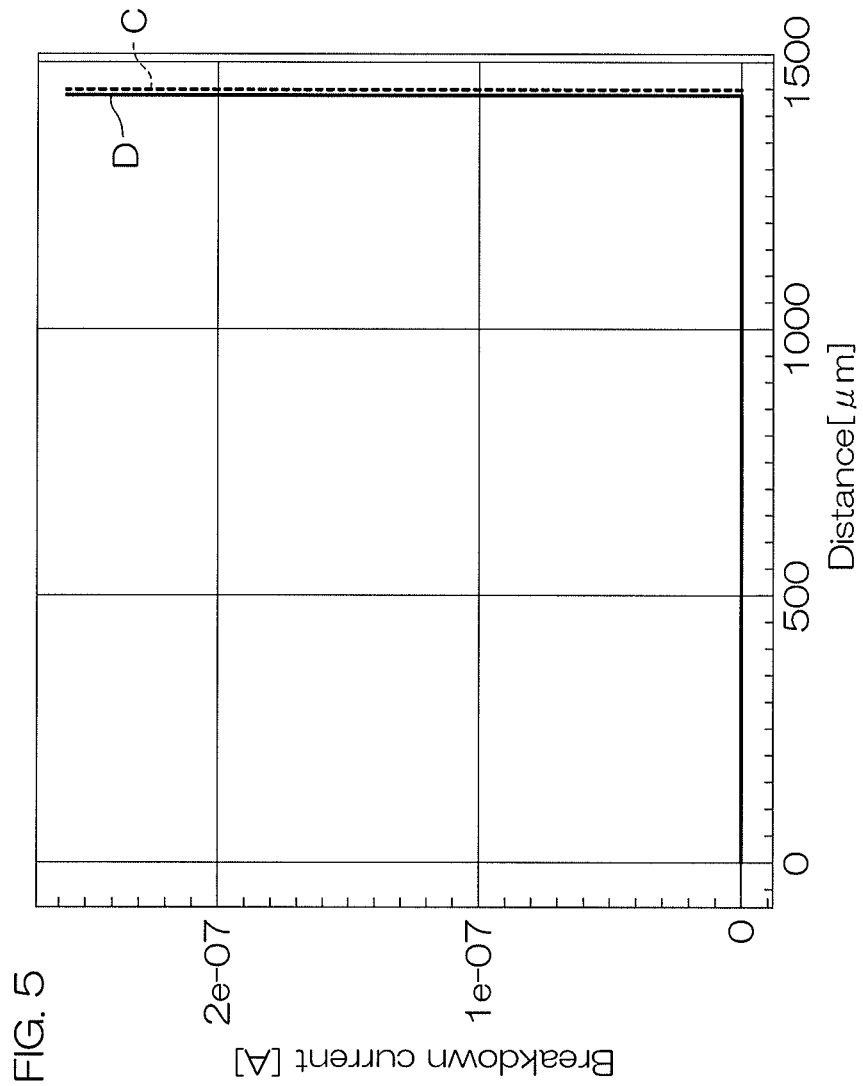
FIG. 5 is a graph showing a breakdown characteristic of the semiconductor device of FIG. 1.

FIG. 5 is a graph showing a breakdown characteristic of the semiconductor device 1 of FIG. 1.

In FIG. 5, the ordinate axis represents a breakdown current [A]. In FIG. 5, the abscissa axis represents a distance [μm]. More specifically, the abscissa axis represents a distance from the lateral surface 5 of the semiconductor layer 2 toward the inner region of the semiconductor layer 2 under the condition that the lateral surface 5 of the semiconductor layer 2 is a zero point.

In FIG. 5, a first characteristic C is shown by a broken line, and a second characteristic D is shown by a solid line. Both the first characteristic C and the second characteristic D are calculated by simulations. The first characteristic C is a breakdown characteristic shown when all of the p$^-$ type low concentration regions 20 are removed from the semiconductor device 1. The second characteristic D is a breakdown characteristic of the semiconductor device 1.

From the first and second characteristics C and D, it is understood that, according to the semiconductor device 1, these breakdown characteristics are substantially equal to each other regardless of the presence or absence of the p$^-$ type low concentration region 20. In other words, it is understood that the formation of the p$^-$ type low concentration region 20 makes it possible to improve the breakdown tolerance of the semiconductor layer 2 without sacrificing the breakdown characteristic.

As described above, according to the semiconductor device 1, it is possible to expand a depletion layer from a region between each of the p$^+$ type field limit regions 14 and the semiconductor layer 2. Simultaneously with this, it is also possible to expand a depletion layer from a region between each of the p$^-$ type low concentration regions 20 and the semiconductor layer 2.

Each of the p$^-$ type low concentration regions 20 has a p type impurity concentration smaller than the p type impurity concentration of each of the p$^+$ type field limit regions 14. Therefore, the depletion layer spreading from each of the p$^-$ type low concentration regions 20 is larger than a depletion layer spreading from each of the p$^+$ type field limit regions 14.

This makes it possible to expand the depletion layer spreading from each of the p$^+$ type field limit regions 14 in the direction opposite to the active region 6. As a result, it is possible to restrain electric field concentration to each of the p$^+$ type field limit regions 14.

Particularly, the electric field concentration to the p$^+$ type field limit region 14 has a tendency to occur at an edge portion positioned on the side opposite to the active region 6. Therefore, it is possible to appropriately restrain the electric field concentration to the p$^+$ type field limit region 14 by forming a p$^-$ type low concentration region 20 in a region on the side opposite to the active region 6 with respect to the p$^+$ type field limit region 14. This makes it possible to prevent the semiconductor layer 2 from being broken because of the electric field concentration to the p$^+$ type field limit region 14.

It is possible to thin the semiconductor layer 2 by improving the breakdown tolerance of the semiconductor layer 2. This makes it possible to reduce on-resistance or makes it possible to miniaturize the semiconductor device 1. It is also possible to reduce the number of p$^+$ type field limit regions 14 if adequate withstand voltage can be obtained by adding the p$^-$ type low concentration region 20. This makes it possible to reduce the exclusive area of the outer region 7 with respect to the semiconductor layer 2, hence making it possible to further miniaturize the semiconductor device 1.

FIG. 6A to FIG. 6F are cross-sectional views to describe a first manufacturing method of the semiconductor device 1 of FIG. 1. Herein, a detailed description will be given of steps of forming the p$^+$ type field limit region 14 and the p$^-$ type low concentration region 20.

Figure 6A:
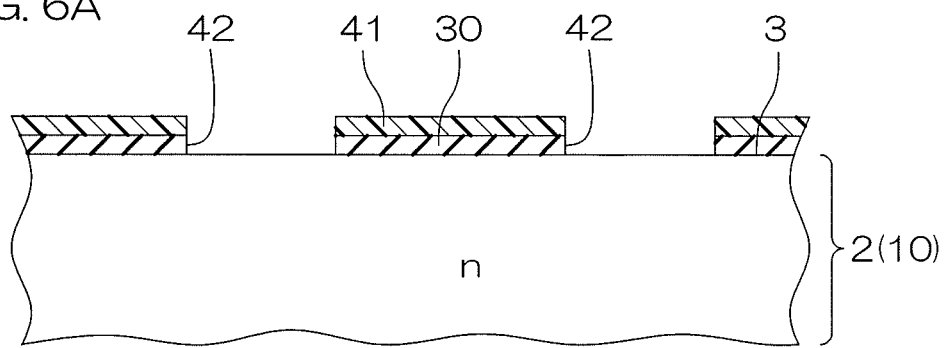
FIG. 6A is a cross-sectional view to describe a first manufacturing method of the semiconductor device of FIG. 1.

Referring to FIG. 6A, the semiconductor layer 2 is first prepared. Thereafter, the insulating layer 30 is formed on the first main surface 3 of the semiconductor layer 2. The insulating layer 30 may be formed by applying an oxidation treatment onto the first main surface 3 of the semiconductor layer 2. The insulating layer 30 may be formed according to a CVD (Chemical Vapor Deposition) method.

Thereafter, the insulating layer 30 is selectively removed (is subjected to patterning). The step of removing the insulating layer 30 may be performed according to an etching method through a mask 41. Hence, a plurality of first openings 42 by which the first main surface 3 of the semiconductor layer 2 is exposed are selectively formed in the insulating layer 30.

The plurality of first openings 42 respectively expose regions in each of which the p$^+$ type field limit region 14 is to be formed in the first main surface 3 of the semiconductor layer 2. The mask 41 may be removed after the step of removing the insulating layer 30 is performed.

Figure 6B:
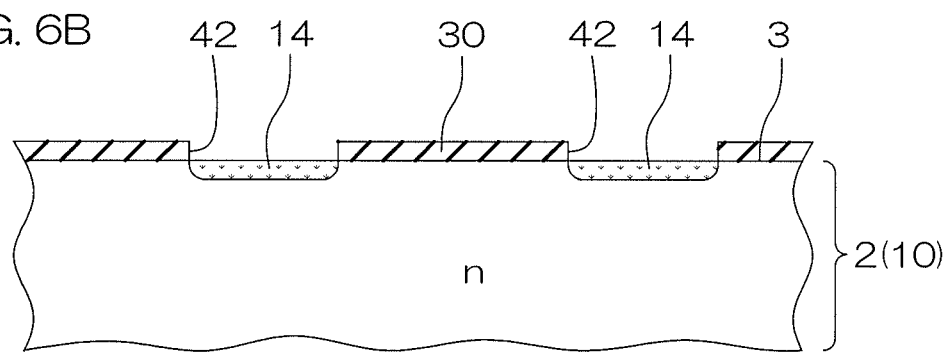
FIG. 6B is a cross-sectional view showing a step subsequent to that of FIG. 6A.

Thereafter, referring to FIG. 6B, a p type impurity that serves as a base for the p$^+$ type field limit region 14 is implanted into the first main surface 3 of the semiconductor layer 2 exposed from the first opening 42.

Figure 6C:
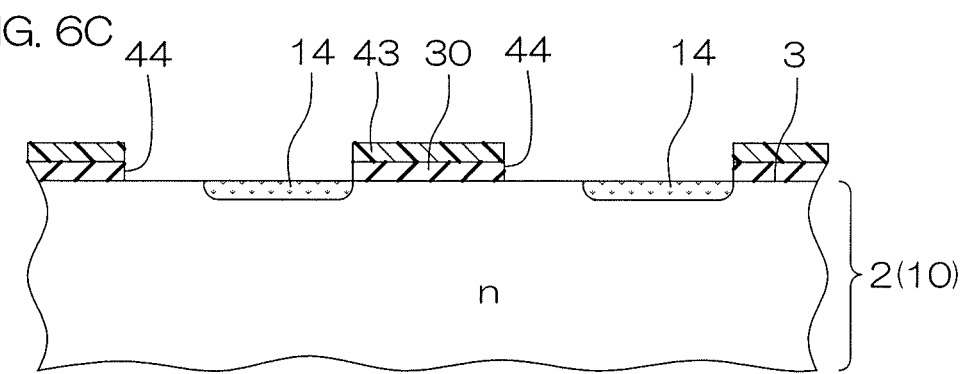
FIG. 6C is a cross-sectional view showing a step subsequent to that of FIG. 6B.

Thereafter, referring to FIG. 6C, the insulating layer 30 is selectively removed (is subjected to patterning). The step of removing the insulating layer 30 may be performed according to an etching method through a mask 43. Hence, a plurality of second openings 44 by which the first main surface 3 of the semiconductor layer 2 is exposed are selectively formed in the insulating layer 30.

The plurality of second openings 44 respectively expose regions in each of which the p$^+$ type field limit region 14 is to be formed and in each of which the p$^-$ type low concentration region 20 is to be formed in the first main surface 3 of the semiconductor layer 2. The mask 43 may be removed after the step of removing the insulating layer 30 is performed.

Thereafter, referring to FIG. 6D, a p type impurity that serves as a base for the p$^-$ type low concentration region 20 is implanted into the first main surface 3 of the semiconductor layer 2 exposed from the second opening 44.

Thereafter, referring to FIG. 6E, a heat treatment is applied onto the semiconductor layer 2. Hence, the p type impurity implanted in the surface layer portion of the first main surface 3 of the semiconductor layer 2 is activated. In this step, the p type impurity diffuses into the semiconductor layer 2. Hence, the plurality of p$^+$ type field limit regions 14 and the plurality of p$^-$ type low concentration regions 20 are formed.

The heat treatment step for the p$^+$ type field limit region 14 and the heat treatment step for the p$^-$ type low concentration region 20 may be performed separately from each other. In other words, the heat treatment step for the p$^+$ type field limit region 14 may be performed prior to the implantation step of the p type impurity that serves as a base for the p$^-$ type low concentration region 20 (see FIG. 6D).

Thereafter, referring to FIG. 6F, the thin film portion 34 of the insulating layer 30 is formed on the first main surface 3 of the semiconductor layer 2 exposed from the second opening 44. The thin film portion 34 of the insulating layer 30 is formed by applying an oxidation treatment onto the first main surface 3 of the semiconductor layer 2.

Thereafter, the thin film portion 34 of the insulating layer 30 is selectively removed (is subjected to patterning). The step of removing the thin film portion 34 of the insulating layer 30 may be performed according to an etching method through a mask (not shown).

Hence, the plurality of second contact holes 32 by which the p$^+$ type field limit regions 14 are respectively exposed are formed. Thereafter, the field electrode 36 is formed. The semiconductor device 1 is manufactured through the aforementioned steps.

FIG. 7A to FIG. 7E are cross-sectional views to describe a second manufacturing method of the semiconductor device 1 of FIG. 1. Herein, a detailed description will be given of steps of forming the p$^+$ type field limit region 14 and the p$^-$ type low concentration region 20.

Figure 7A:
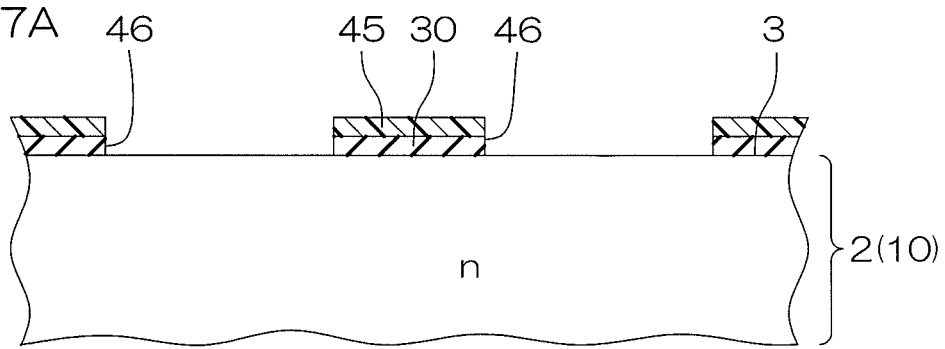
FIG. 7A is a cross-sectional view to describe a second manufacturing method of the semiconductor device of FIG. 1.

Referring to FIG. 7A, the semiconductor layer 2 is first prepared. Thereafter, the insulating layer 30 is formed on the first main surface 3 of the semiconductor layer 2. The insulating layer 30 may be formed by applying an oxidation treatment onto the first main surface 3 of the semiconductor layer 2. The insulating layer 30 may be formed according to a CVD method.

Thereafter, the insulating layer 30 is selectively removed (is subjected to patterning). The step of removing the insulating layer 30 may be performed according to an etching method through a mask 45. Hence, a plurality of third openings 46 by which the first main surface 3 of the semiconductor layer 2 is exposed are selectively formed in the insulating layer 30.

The plurality of third openings 46 simultaneously expose regions in each of which each of the p$^+$ type field limit regions 14 and each of the p$^-$ type low concentration regions 20 are to be formed in the first main surface 3 of the semiconductor layer 2. The mask 45 may be removed after the step of removing the insulating layer 30 is performed.

Figure 7B:
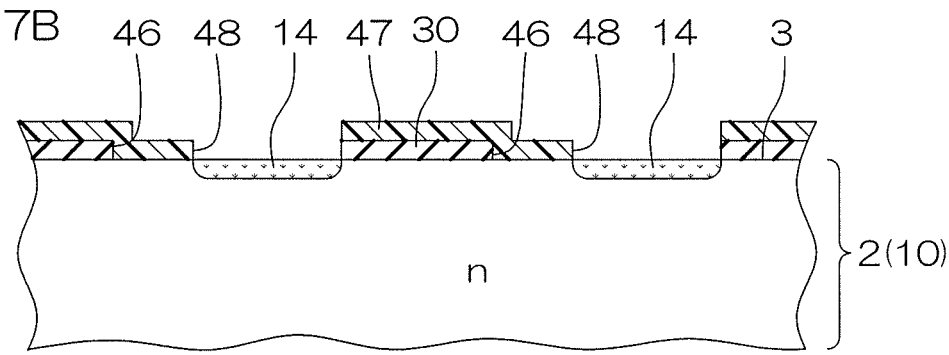
FIG. 7B is a cross-sectional view showing a step subsequent to that of FIG. 7A.

Thereafter, referring to FIG. 7B, an ion implantation mask 47 that has a predetermined pattern is formed on the first main surface 3 of the semiconductor layer 2. The ion implantation mask 47 covers the insulating layer 30. The ion implantation mask 47 has a fourth opening 48 that exposes a region in which the p$^+$ type field limit region 14 is to be formed in the first main surface 3 of the semiconductor layer 2.

Thereafter, a p type impurity that serves as a base for the p$^+$ type field limit region 14 is implanted into the first main surface 3 of the semiconductor layer 2 exposed from the fourth opening 48. The ion implantation mask 47 may be removed after the step of implanting the p type impurity is performed.

Figure 7C:
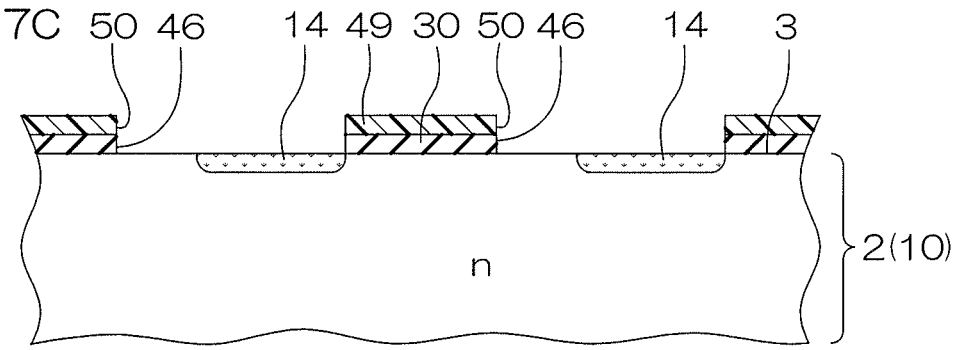
FIG. 7C is a cross-sectional view showing a step subsequent to that of FIG. 7B.

Thereafter, referring to FIG. 7C, an ion implantation mask 49 that has a predetermined pattern is formed on the first main surface 3 of the semiconductor layer 2. The ion implantation mask 49 covers the insulating layer 30. The ion implantation mask 49 has a fifth opening 50 that exposes a region in which the p$^-$ type low concentration region 20 is to be formed in the first main surface 3 of the semiconductor layer 2.

Figure 7D:
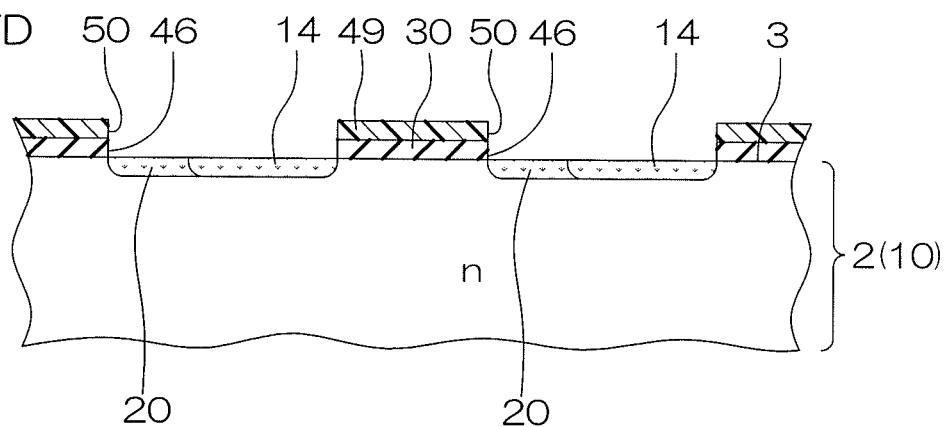
FIG. 7D is a cross-sectional view showing a step subsequent to that of FIG. 7C.

Thereafter, referring to FIG. 7D, a p type impurity that serves as a base for the p$^-$ type low concentration region 20 is implanted into the first main surface 3 of the semiconductor layer 2 exposed from the fifth opening 50. The ion implantation mask 49 may be removed after the step of implanting the p type impurity is performed.

In the steps of FIGS. 7C and 7D, the step of forming the ion implantation mask 49 may be omitted. In other words, the p type impurity that serves as a base for the p$^-$ type low concentration region 20 may be implanted into the first main surface 3 of the semiconductor layer 2 while using the insulating layer 30 as an ion implantation mask.

Figure 7E:
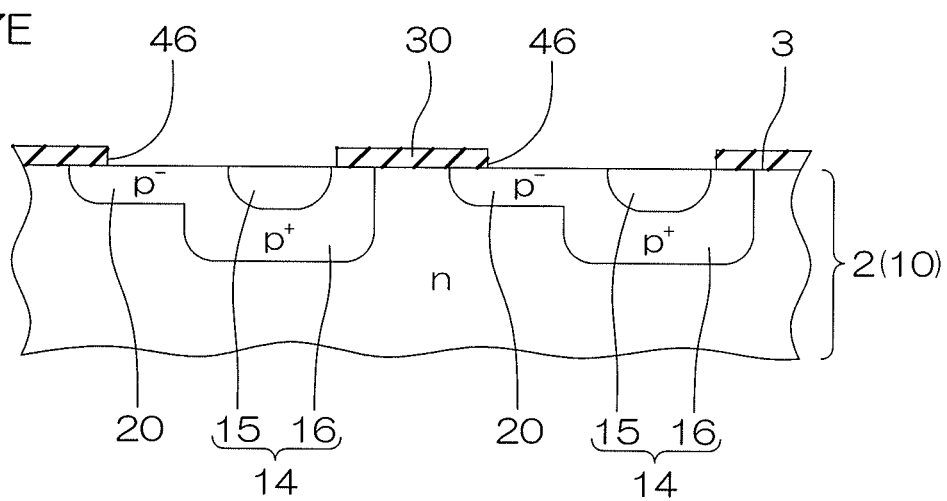
FIG. 7E is a cross-sectional view showing a step subsequent to that of FIG. 7D.

Thereafter, referring to FIG. 7E, a heat treatment is applied onto the semiconductor layer 2. Hence, the p type impurity implanted in the surface layer portion of the first main surface 3 of the semiconductor layer 2 is activated. In this step, the p type impurity diffuses into the semiconductor layer 2. Hence, the plurality of p$^+$ type field limit regions 14 and the plurality of p$^-$ type low concentration regions 20 are formed.

The heat treatment step for the p$^+$ type field limit region 14 and the heat treatment step for the p$^-$ type low concentration region 20 may be performed separately from each other. In other words, the heat treatment step for the p$^+$ type field limit region 14 may be performed prior to the implantation step of the p type impurity that serves as a base for the p$^-$ type low concentration region 20 (see FIG. 7D).

Thereafter, the same step as that of FIG. 6F is performed. The semiconductor device 1 is manufactured through the aforementioned steps.

Figure 8:
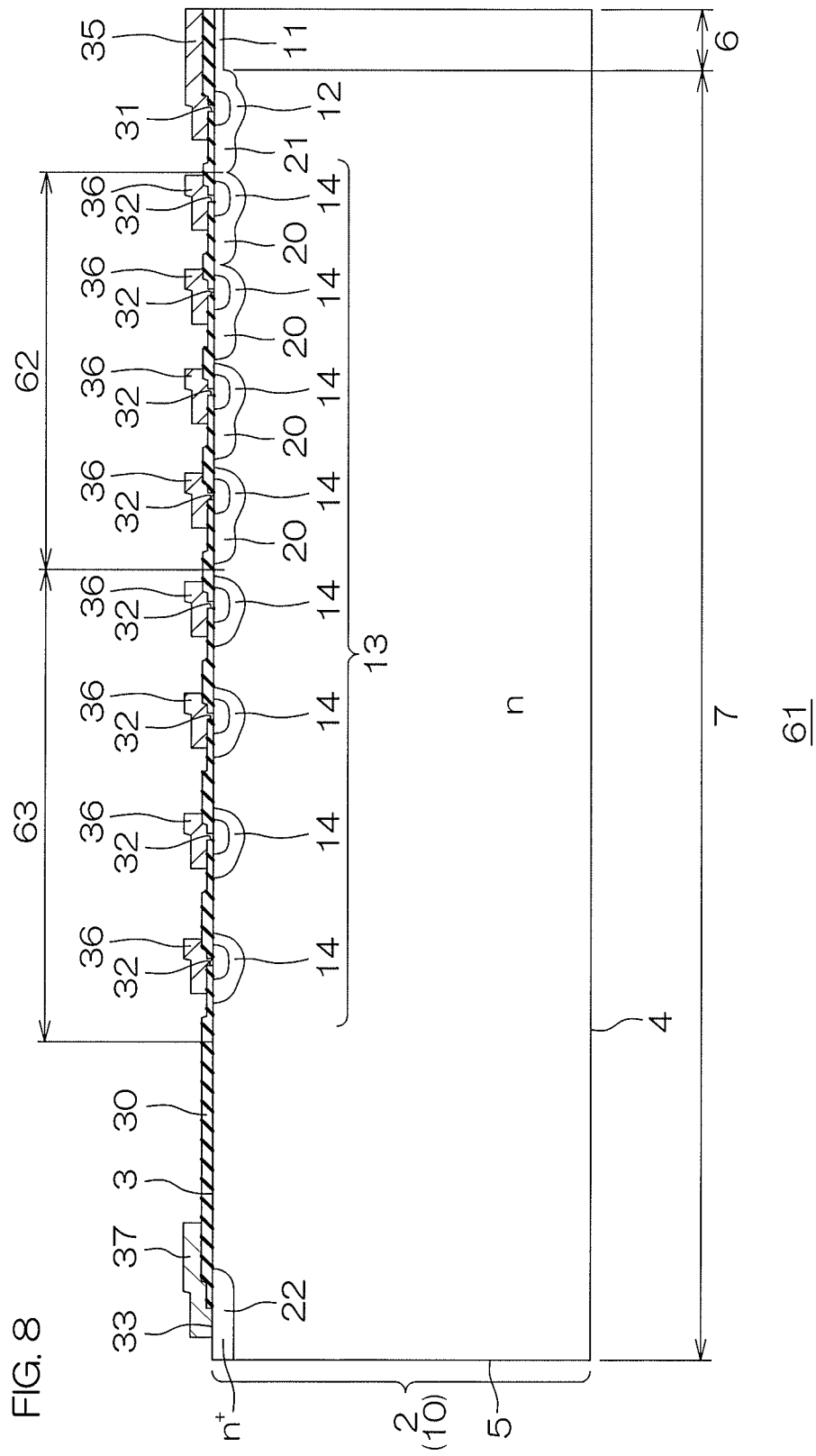
FIG. 8 is a cross-sectional view showing a semiconductor device according to a second preferred embodiment of the present invention.

FIG. 8 is a cross-sectional view showing a semiconductor device 61 according to a second preferred embodiment of the present invention. In the following second preferred embodiment, the same reference sign is given to a structure equivalent to each structure described with respect to the semiconductor device 1, and a description of the structure equivalent thereto is omitted.

Referring to FIG. 8, the field-limit-region group 13 includes a first region 62 and a second region 63. The first region 62 includes one or a plurality of $p^+$ type field limit regions 14 adjacent to the active region 6. In the present preferred embodiment, the first region 62 includes a plurality of (herein, four) $p^+$ type field limit regions 14, which are a first half, adjacent to the active region 6.

The second region 63 includes one or a plurality of $p^+$ type field limit regions 14 formed in a region on the side opposite to the active region 6 with respect to the first region 62. In the present preferred embodiment, the second region 63 includes a plurality of (herein, four) $p^+$ type field limit regions 14, which are a latter half, formed in a region on the side opposite to the active region 6 with respect to the first region 62.

If the number of $p^+$ type field limit regions 14 is an odd number, the $p^+$ type field limit region 14 placed at an intermediate position may be included in the first region 62, or may be included in the second region 63.

If the field-limit-region group 13 consists of two $p^+$ type field limit regions 14, each of the first and second regions 62 and 63 includes one $p^+$ type field limit region 14.

The electric field strength to be relaxed in the peripheral edge portion of the semiconductor layer 2 is smaller than the electric field strength to be relaxed in the inner portion of the semiconductor layer 2. The number of $p^+$ type field limit regions 14 in the first region 62 and the number of $p^+$ type field limit regions 14 in the second region 63 can be set on the basis of the magnitude of the electric field strength to be relaxed.

In the present preferred embodiment, the $p^-$ type low concentration region 20 is formed only in the first region 62 of the field-limit-region group 13. In the present preferred embodiment, the plurality of $p^-$ type low concentration regions 20 are formed in one-to-one correspondence with respect to the plurality of $p^+$ type field limit regions 14 positioned in the first region 62.

In other words, the $p^-$ type low concentration region 20 is connected to all of the $p^+$ type field limit regions 14. The $p^-$ type low concentration region 20 may be formed with respect to an arbitrary one of the $p^+$ type field limit regions 14 positioned in the first region 62.

At least one of the $p^-$ type low concentration regions 20 may be formed with respect to the plurality of $p^+$ type field limit regions 14 positioned in the first region 62. In other words, one or more of the $p^-$ type low concentration regions 20 may be formed with respect to the plurality of $p^+$ type field limit regions 14 positioned in the first region 62.

The first, second, third, or fourth mode example, or the mode example in which arbitrary two or more of the first to fourth mode examples are combined together, which have been described in the aforementioned first preferred embodiment, may be applied to the plurality of $p^-$ type low concentration regions 20 formed in the first region 62.

As described above, in the semiconductor device 61, it is possible to fulfill the same effect as in the semiconductor device 1. According to the semiconductor device 61, the $p^-$ type low concentration region 20 is also formed only in the first region 62 of the field-limit-region group 13. The thus formed structure is employed, for example, in a case in which the electric field strength can be sufficiently relaxed only by the $p^-$ type low concentration region 20 formed in the first region 62.

In this case, the $p^-$ type low concentration region 20 that is to be formed in the second region 63 can be omitted. Therefore, it is possible to miniaturize the semiconductor device 1 by reducing the exclusive area of the outer region 7 with respect to the semiconductor layer 2.

Figure 9:
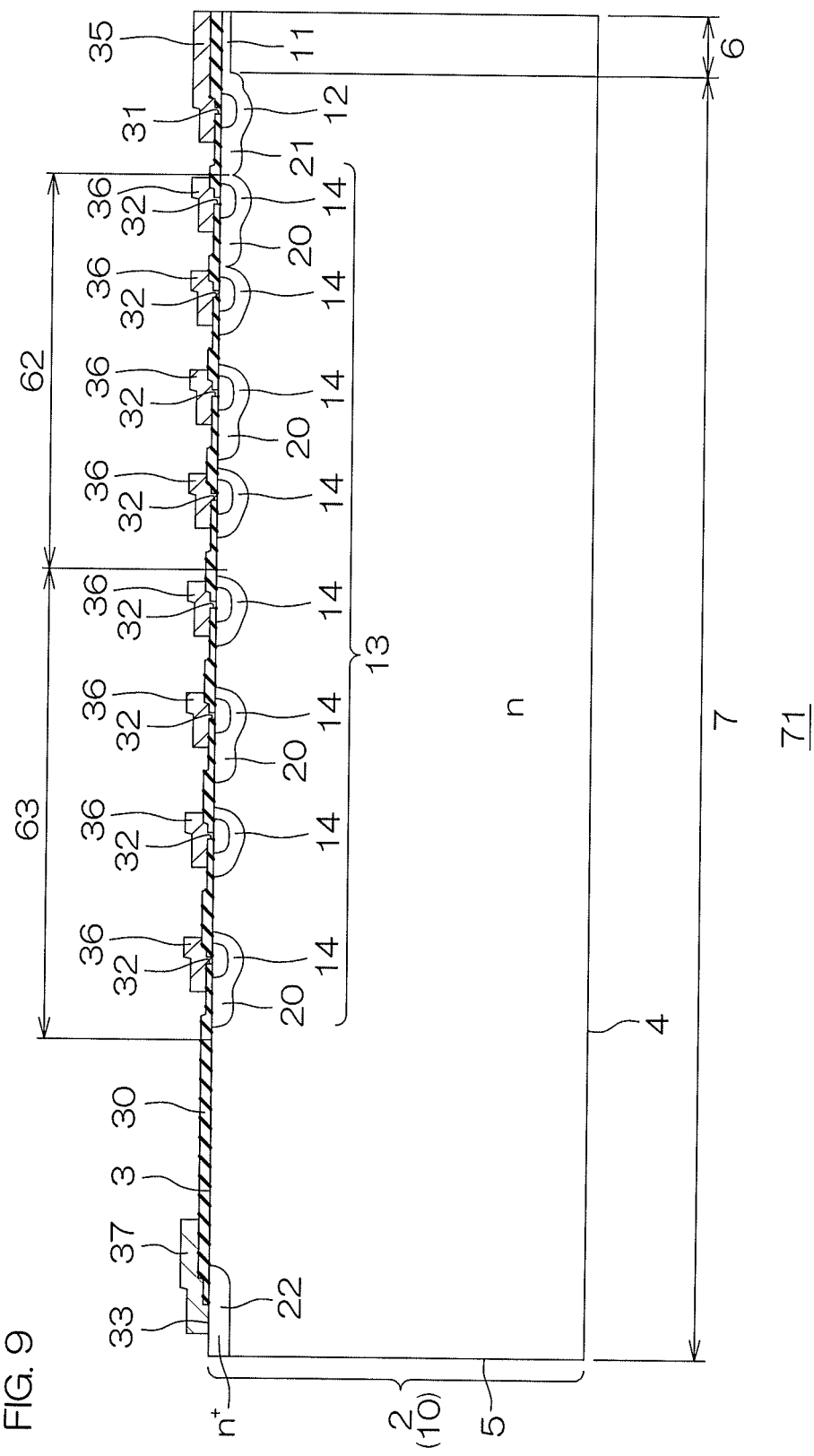
FIG. 9 is a cross-sectional view showing a semiconductor device according to a third preferred embodiment of the present invention.

FIG. 9 is a cross-sectional view showing a semiconductor device 71 according to a third preferred embodiment of the present invention. In the following third preferred embodiment, the same reference sign is given to a structure equivalent to each structure described with respect to the semiconductor device 61, and a description of the structure equivalent thereto is omitted.

Referring to FIG. 9, the $p^-$ type low concentration region 20 is formed in each of the first and second regions 62 and 63 of the field-limit-region group 13 in the present preferred embodiment.

In the first region 62, the plurality of $p^-$ type low concentration regions 20 are formed in one-to-one correspondence with respect to the plurality of $p^+$ type field limit regions 14 positioned in the first region 62 in the present preferred embodiment.

In the first region 62, each of the plurality of $p^-$ type low concentration regions 20 may be formed with a mutually equal p type impurity concentration. In the first region 62, each of the plurality of $p^-$ type low concentration regions 20 may be formed with a mutually different p type impurity concentration.

The first, second, third, or fourth mode example, or the mode example in which arbitrary two or more of the first to fourth mode examples are combined together, which have been described in the aforementioned first preferred embodiment, may be applied to the plurality of $p^-$ type low concentration regions 20 formed in the first region 62.

In the second region 63, the plurality of $p^-$ type low concentration regions 20 are formed in one-to-one correspondence with respect to arbitrary two of the plurality of $p^+$ type field limit regions 14 positioned in the second region 63 in the present preferred embodiment.

In the second region 63, each of the plurality of $p^-$ type low concentration regions 20 may be formed with a mutually equal p type impurity concentration. In the second region 63, each of the plurality of $p^-$ type low concentration regions 20 may be formed with a mutually different p type impurity concentration.

The first, second, third, or fourth mode example, or the mode example in which arbitrary two or more of the first to fourth mode examples are combined together, which have been described in the aforementioned first preferred embodiment, may be applied to the plurality of $p^-$ type low concentration regions 20 formed in the second region 63.

The p type impurity concentration of one or more of the $p^-$ type low concentration regions 20 formed in the second region 63 may be lower than the p type impurity concentration of one or more of the plurality of $p^-$ type low concentration regions 20 formed in the first region 62.

The width W of one or more of the plurality of $p^-$ type low concentration regions 20 formed in the second region 63 may be smaller than the width W of one or more of the plurality of $p^-$ type low concentration regions 20 formed in the first region 62.

The depth D2 of one or more of the plurality of $p^-$ type low concentration regions 20 formed in the second region 63 may be smaller than the depth D2 of one or more of the plurality of $p^-$ type low concentration regions 20 formed on the first-region-62 side.

The width of the depletion layer spreading from one or more of the plurality of $p^-$ type low concentration regions 20 formed in the second region 63 may be smaller than the width of the depletion layer spreading from one or more of the plurality of p⁻ type low concentration regions 20 formed in the first region 62.

As described above, in the semiconductor device 71, it is possible to fulfill the same effect as in the semiconductor device 1. According to the semiconductor device 71, it is also possible to appropriately form one or more p⁻ type low concentration regions 20 with respect to a region whose electric field strength is to be relaxed in each of the first and second regions 62 and 63 of the field-limit-region group 13. This makes it possible to make an appropriate design according to electric characteristics of the functional device 8 in the outer region 7.

Figure 10:
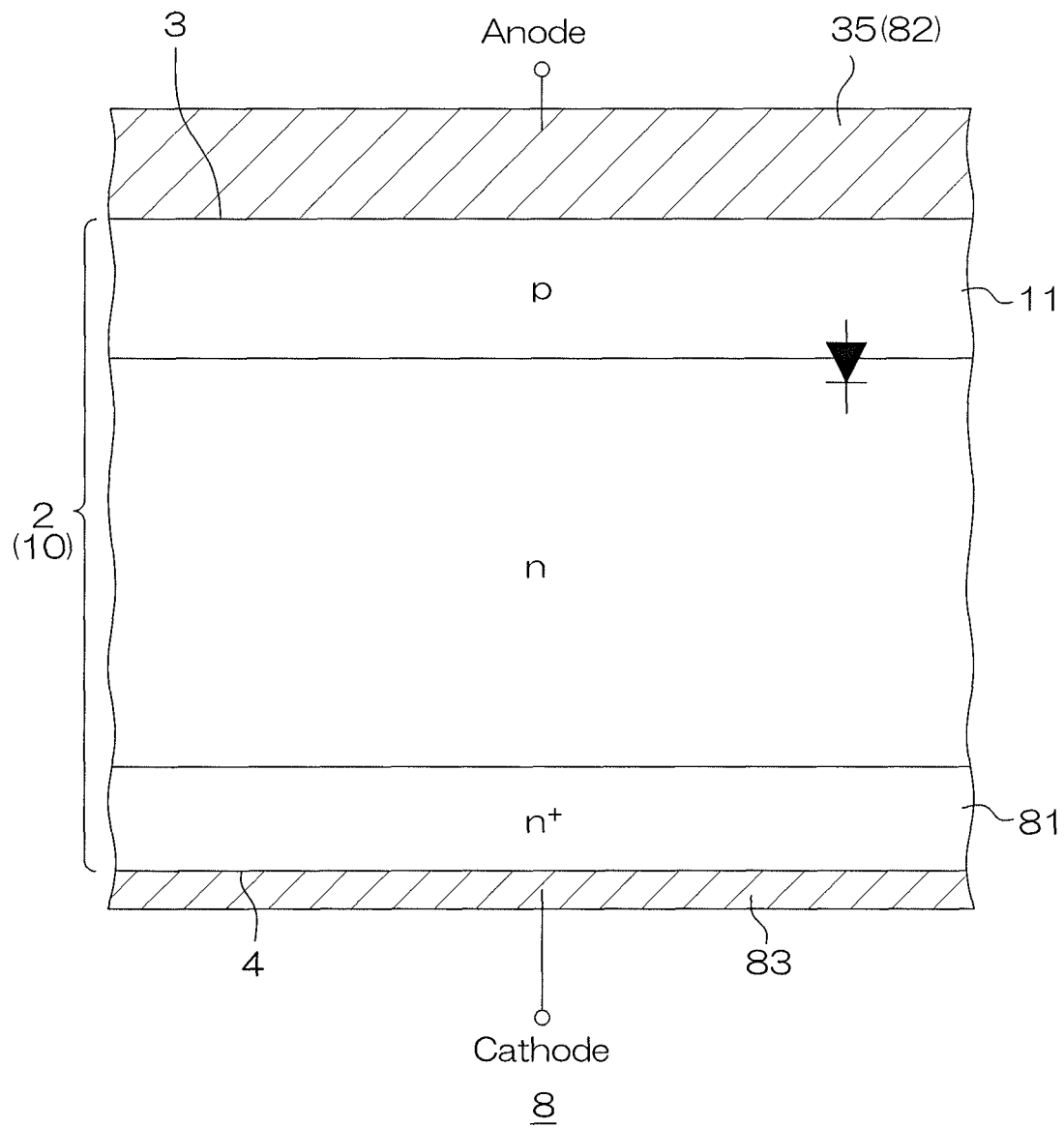
FIG. 10 is a cross-sectional view showing a first mode example of a functional device applied to the semiconductor device according to the first to third preferred embodiments.

FIG. 10 is a cross-sectional view showing a first mode example of the functional device 8 applied to the semiconductor devices 1, 61, and 71 according to the first to third preferred embodiments. In the following first mode example, the same reference sign is given to a structure equivalent to each structure described with respect to the semiconductor devices 1, 61, and 71, and a description of the structure equivalent thereto is omitted.

In the present mode example, the functional device 8 includes a p-n junction diode. The p-n junction diode is a first recovery diode in which the p type impurity region 11 serves as an anode and in which the semiconductor layer 2 serves as a cathode.

An n⁺ type impurity region 81 is formed at the surface layer portion of the second main surface 4 of the semiconductor layer 2. In the present mode example, the main electrode 35 is formed as an anode electrode 82. A cathode electrode 83 is connected to the second main surface 4 of the semiconductor layer 2.

As described above, it is possible to improve the breakdown tolerance of the semiconductor layer 2 even if the functional device 8 includes the p-n junction diode. The functional device 8 may include a Schottky barrier diode instead of the p-n junction diode. In this case, the anode electrode 82 and the p type impurity region 11 make a Schottky junction with each other.

Figure 11:
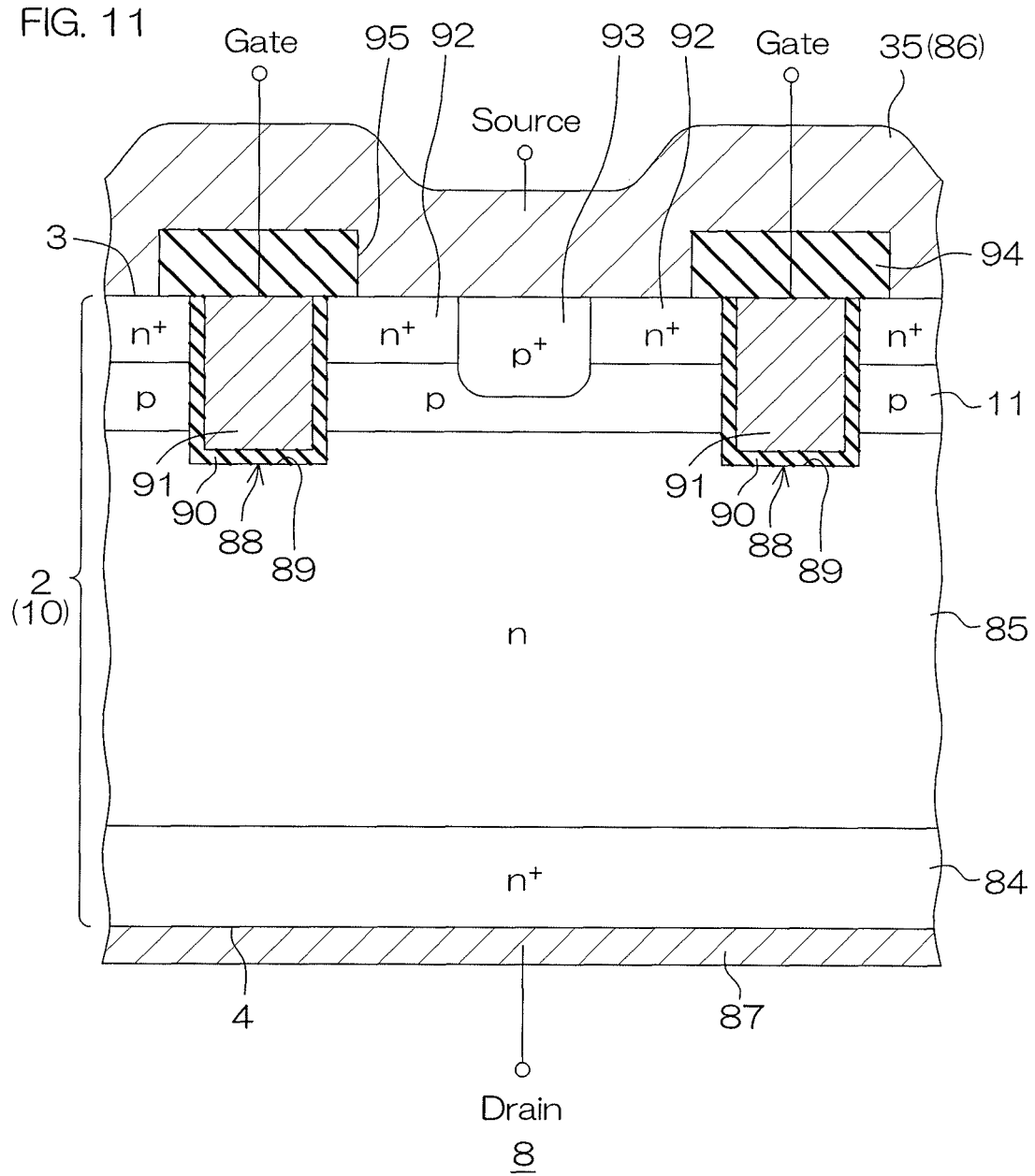
FIG. 11 is a cross-sectional view showing a second mode example of the functional device applied to the semiconductor device according to the first to third preferred embodiments.

FIG. 11 is a cross-sectional view showing a second mode example of the functional device 8 applied to the semiconductor devices 1, 61, and 71 according to the first to third preferred embodiments. In the following second mode example, the same reference sign is given to a structure equivalent to each structure described with respect to the semiconductor devices 1, 61, and 71, and a description of the structure equivalent thereto is omitted.

In the present mode example, the functional device 8 includes a trench-gate type MISFET. An n⁺ type drain region 84 is formed at the surface layer portion of the second main surface 4 of the semiconductor layer 2. The semiconductor layer 2 is formed as an n type drain drift region 85. The main electrode 35 is formed as a source electrode 86. A drain electrode 87 is connected to the second main surface 4 of the semiconductor layer 2.

In the present mode example, the p type impurity region 11 is formed as a p type body region of the MISFET. A plurality of trench gate structures 88 are formed at the first main surface 3 of the semiconductor layer 2 in the active region 6.

The plurality of trench gate structures 88 may be formed in a belt shape extending along an arbitrary direction in plan view. Hence, the plurality of trench gate structures 88 may be formed in a stripe shape as a whole. A single trench gate structure 88 that is latticed in plan view may be formed instead of the plurality of trench gate structures 88.

Each of the trench gate structures 88 includes a gate trench 89 formed at the first main surface 3 of the semiconductor layer 2. Each of the gate trenches 89 passes through the p type impurity region 11. A bottom portion of each of the gate trenches 89 is positioned in the n type drain drift region 85. A gate electrode 91 is buried in each of the gate trenches 89 with a gate insulating film 90 between the gate electrode 91 and the gate trench 89.

In a region between the mutually adjoining trench gate structures 88, the p type impurity region 11 is shared between one trench gate structure 88 and the other trench gate structure 88. An n⁺ type source region 92 is formed beside each of the trench gate structures 88 in the surface layer portion of the p type impurity region 11.

An n⁺ type source region 92, a p type impurity region 11, and an n type drain drift region 85 are formed in this order beside each of the trench gate structures 88 from the first-main surface-3 side of the semiconductor layer 2 toward the second-main surface-4 side. A region between the n⁺ type source region 92 and the n type drain drift region 85 in the p type impurity region 11 is a channel region of the MISFET.

A p⁺ type contact region 93 is also formed at the surface layer portion of the p type impurity region 11. The p⁺ type contact region 93 passes through the n⁺ type source region 92, and is electrically connected to the p type impurity region 11.

In the active region 6, an insulating layer 94 is formed on the first main surface 3 of the semiconductor layer 2. The insulating layer 94 selectively covers the active region 6. A source contact hole 95 is formed in the insulating layer 94. The source contact hole 95 exposes the n⁺ type source region 92 and the p⁺ type contact region 93.

The main electrode 35 enters the source contact hole 95 from above the insulating layer 94. The main electrode 35 is electrically connected to the n⁺ type source region 92 and to the p⁺ type contact region 93 in the source contact hole 95.

As described above, it is possible to improve the breakdown tolerance of the semiconductor layer 2 even if the functional device 8 includes the trench-gate type MISFET.

Figure 12:
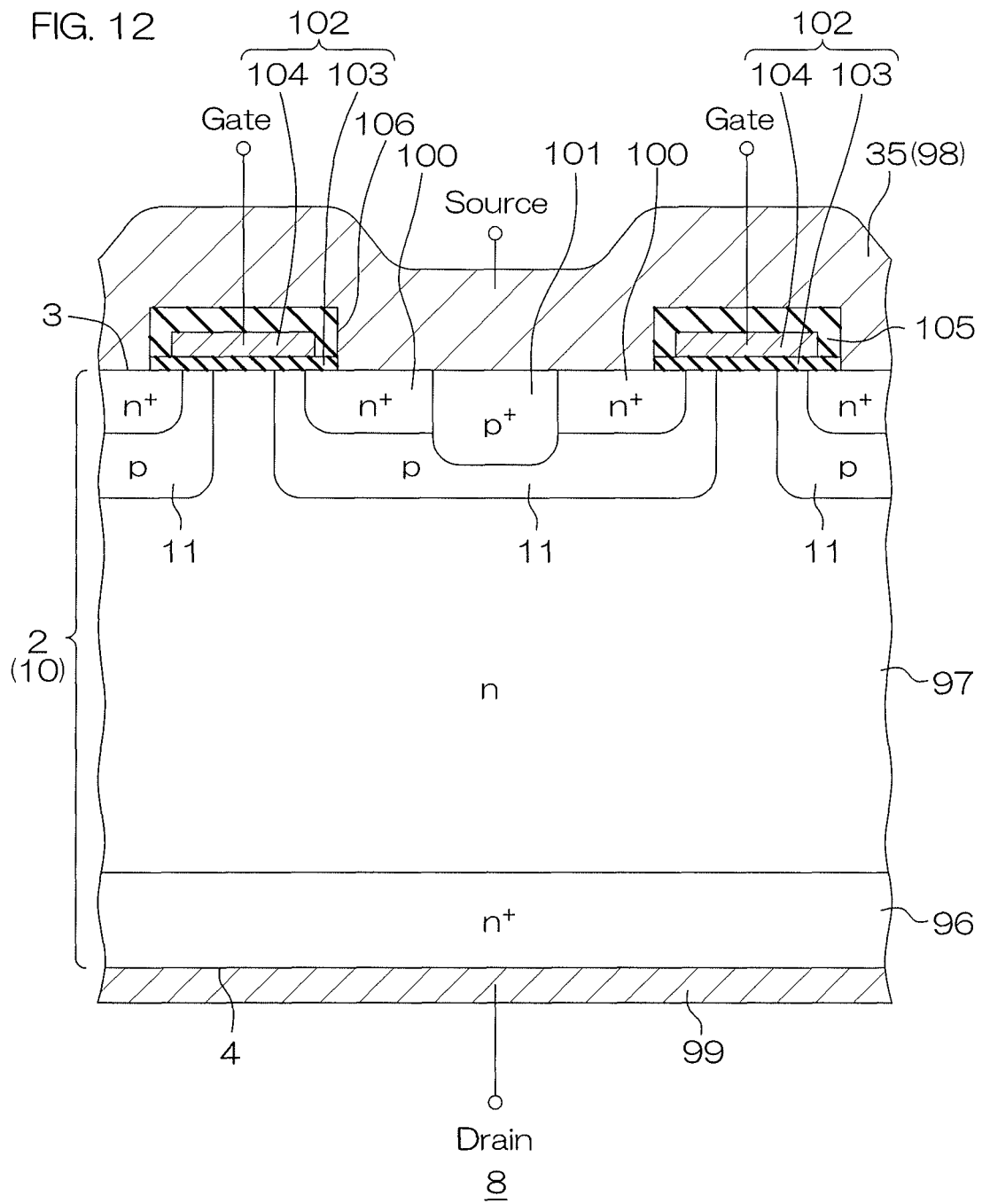
FIG. 12 is a cross-sectional view showing a third mode example of the functional device applied to the semiconductor device according to the first to third preferred embodiments.

FIG. 12 is a cross-sectional view showing a third mode example of the functional device 8 applied to the semiconductor devices 1, 61, and 71 according to the first to third preferred embodiments. In the following third mode example, the same reference sign is given to a structure equivalent to each structure described with respect to the semiconductor devices 1, 61, and 71, and a description of the structure equivalent thereto is omitted.

In the present mode example, the functional device 8 includes a planar-gate type MISFET. An n⁺ type drain region 96 is formed at the surface layer portion of the second main surface 4 of the semiconductor layer 2. The semiconductor layer 2 is formed as an n type drain drift region 97. The main electrode 35 is formed as a source electrode 98. A drain electrode 99 is connected to the second main surface 4 of the semiconductor layer 2.

The plurality of p type impurity regions 11 are formed with intervals between the p type impurity regions 11 at the surface layer portion of the first main surface 3 of the semiconductor layer 2 in the active region 6. In the present mode example, the p type impurity region 11 is formed as a p type body region of the MISFET.

The plurality of p type impurity regions 11 may be formed in a belt shape extending along an arbitrary direction in plan view. The plurality of p type impurity regions 11 may be formed in a stripe shape as a whole in plan view.

The active region 6 is defined by the plurality of p type impurity regions 11. The active region 6 is also defined by a region surrounded by the p⁺ type main junction region 12. The inner peripheral edge of the p⁺ type main junction region 12 may be connected to the p type impurity region 11.

An n⁺ type source region 100 is formed at the surface layer portion of each of the p type impurity regions 11. The n⁺ type source region 100 is formed with an interval from the peripheral edge of each of the p type impurity regions 11 toward its inner region.

A p⁺ type contact region 101 is formed at the surface layer portion of each of the p type impurity regions 11. The p⁺ type contact region 101 passes through the n⁺ type source region 100 in the inner region of each of the p type impurity regions 11.

A plurality of planar gate structures 102 are formed on the first main surface 3 of the semiconductor layer 2 in the active region 6. The plurality of planar gate structures 102 are formed in a belt shape extending along the p type impurity region 11 in plan view.

The plurality of planar gate structures 102 are formed in a stripe shape as a whole in plan view. Each of the planar gate structures 102 is formed on a region between the mutually adjoining p type impurity regions 11 on the first main surface 3 of the semiconductor layer 2.

Each of the planar gate structures 102 has a layered structure including a gate insulating film 103 and a gate electrode 104. The gate electrode 104 faces the n type drain drift region 97, the p type impurity region 11, and the n⁺ type source region 92 with the gate insulating film 103 between these regions.

In the active region 6, an insulating layer 105 is formed on the first main surface 3 of the semiconductor layer 2. The insulating layer 105 selectively covers the active region 6. A source contact hole 106 is formed in the insulating layer 105. The source contact hole 106 exposes the n⁺ type source region 100 and the p⁺ type contact region 101.

The main electrode 35 enters the source contact hole 106 from above the insulating layer 105. The main electrode 35 is electrically connected to the n⁺ type source region 100 and to the p⁺ type contact region 101 in the source contact hole 106.

As described above, it is possible to improve the breakdown tolerance of the semiconductor layer 2 even if the functional device 8 includes the planar-gate type MISFET.

Figure 13:
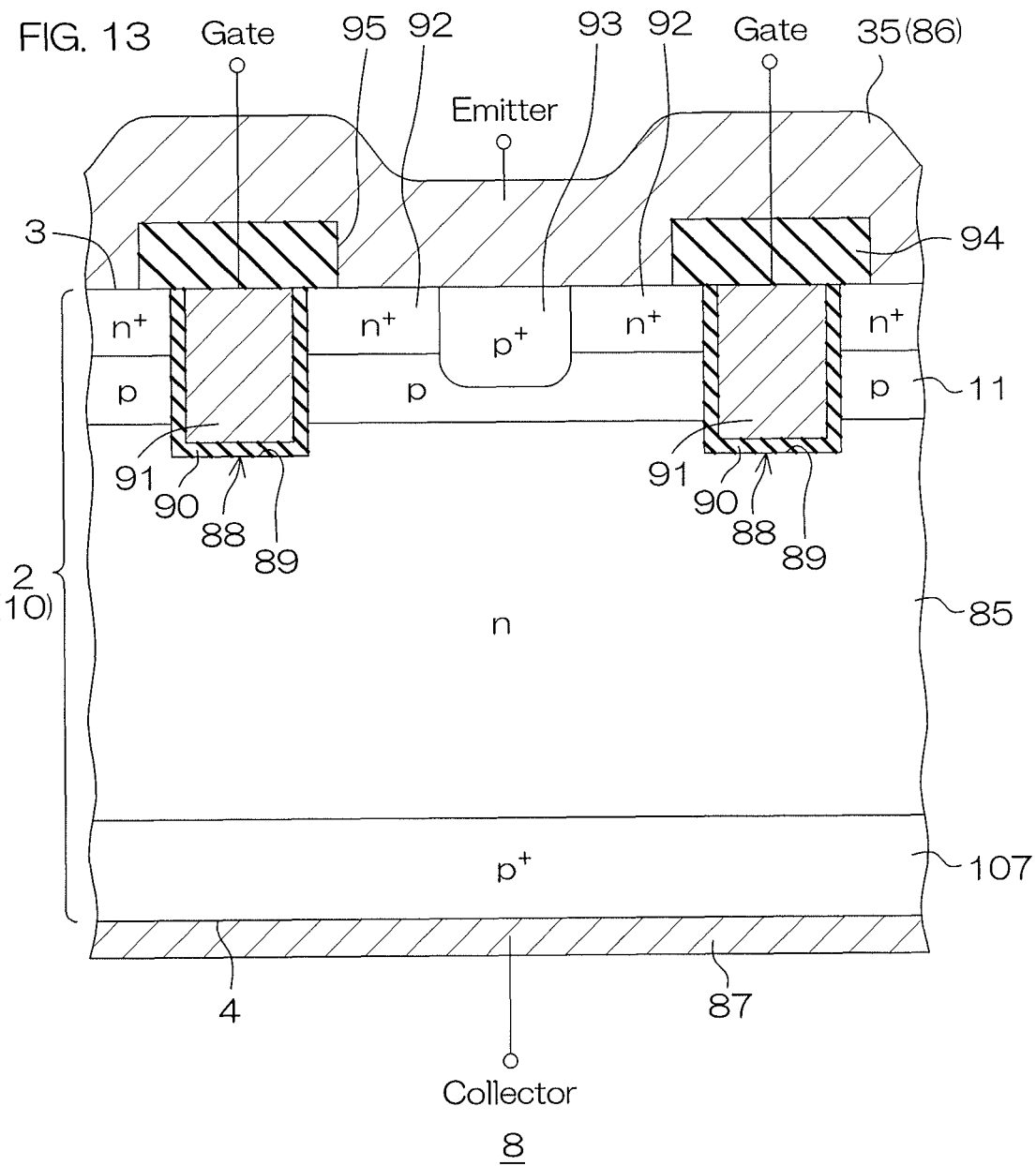
FIG. 13 is a cross-sectional view showing a fourth mode example of the functional device applied to the semiconductor device according to the first to third preferred embodiments.

FIG. 13 is a cross-sectional view showing a fourth mode example of the functional device 8 applied to the semiconductor devices 1, 61, and 71 according to the first to third preferred embodiments. In the following fourth mode example, the same reference sign is given to a structure equivalent to each structure described with respect to the semiconductor devices 1, 61, and 71, and a description of the structure equivalent thereto is omitted.

In the present mode example, the functional device 8 includes a trench-gate type IGBT instead of the trench-gate type MISFET according to the second mode example (also see FIG. 11). In other words, a p⁺ type collector region 107 is formed at the surface layer portion of the second main surface 4 of the semiconductor layer 2 instead of the n⁺ type drain region 84 (also see FIG. 11).

In this case, the "source" of the MISFET according to the second mode example is read as the "emitter" of the IGBT. The "drain" of the MISFET according to the second mode example is also read as the "collector" of the IGBT.

As described above, it is possible to improve the breakdown tolerance of the semiconductor layer 2 even if the functional device 8 includes the trench-gate type IGBT.

Figure 14:
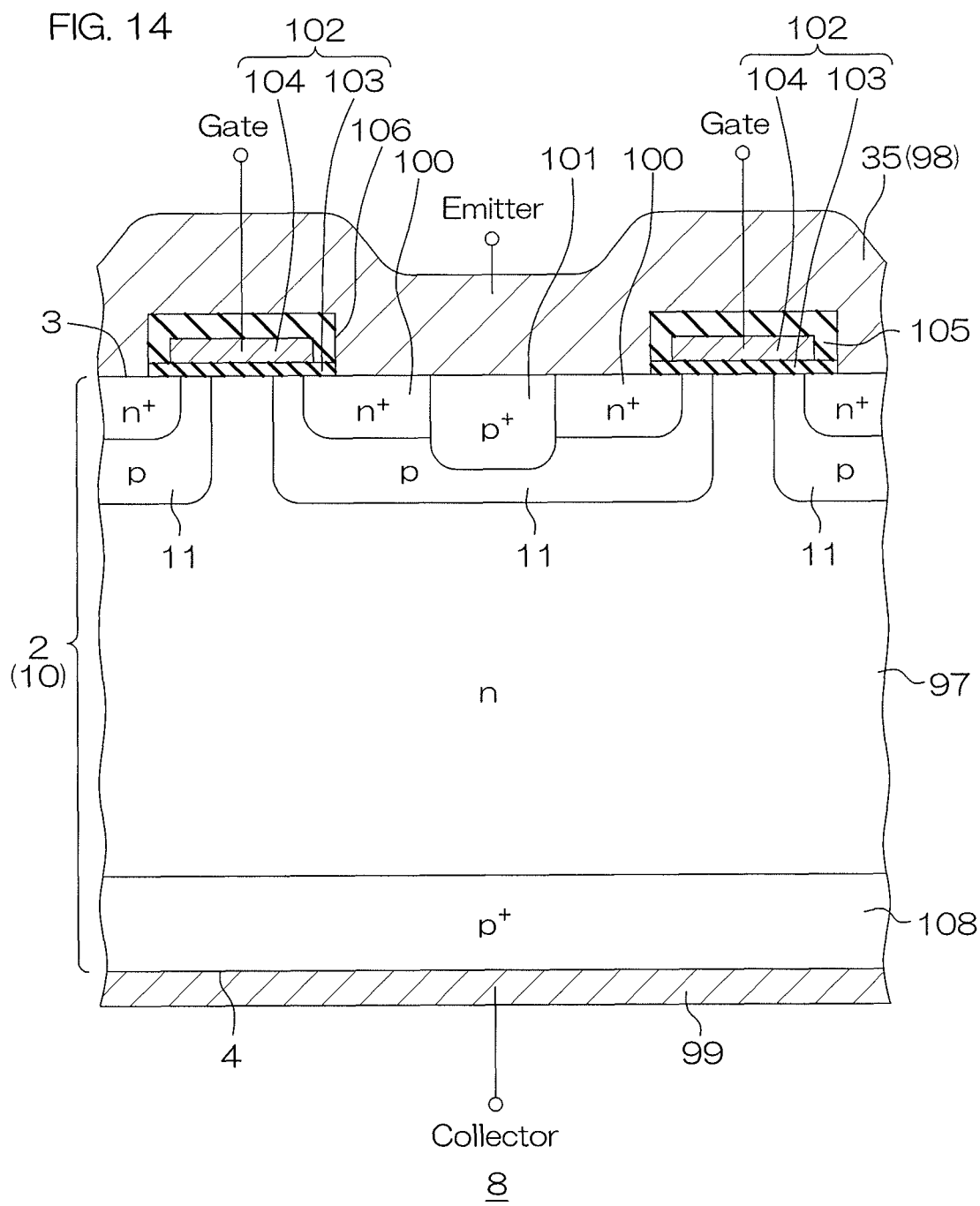
FIG. 14 is a cross-sectional view showing a fifth mode example of the functional device applied to the semiconductor device according to the first to third preferred embodiments.

FIG. 14 is a cross-sectional view showing a fifth mode example of the functional device 8 applied to the semiconductor devices 1, 61, and 71 according to the first to third preferred embodiments. In the following fifth mode example, the same reference sign is given to a structure equivalent to each structure described with respect to the semiconductor devices 1, 61, and 71, and a description of the structure equivalent thereto is omitted.

In the present mode example, the functional device 8 includes a planar-gate type IGBT instead of the planar-gate type MISFET according to the third mode example (also see FIG. 12). In other words, a p⁺ type collector region 108 is formed at the surface layer portion of the second main surface 4 of the semiconductor layer 2 instead of the n⁺ type drain region 96 (also see FIG. 12).

In this case, the "source" of the MISFET according to the third mode example is read as the "emitter" of the IGBT. The "drain" of the MISFET according to the third mode example is also read as the "collector" of the IGBT.

As described above, it is possible to improve the breakdown tolerance of the semiconductor layer 2 even if the functional device 8 includes the planar-gate type IGBT.

Although the preferred embodiments of the present invention have been described as above, the present invention can be embodied in still other modes.

As described in the first to third preferred embodiments, the plurality of p⁺ type field limit regions 14 are formed. However, a structure in which only one p⁺ type field limit region 14 is formed may be employed. Even in the thus formed structure, it is possible to obtain the effect of restraining electric field concentration by forming the p⁻ type low concentration region 20 with respect to the p⁺ type field limit region 14.

In the first to third preferred embodiments, each of the second contact holes 32 may selectively expose a corresponding one of the p⁻ type low concentration regions 20 in addition to a corresponding one of the p⁺ type field limit regions 14. In this case, each of the field electrodes 36 may be connected to the p⁺ type field limit region 14 and to the p⁻ type low concentration region 20.

In the first to third preferred embodiments, the main electrode 35 may be connected to the p⁻ type main junction low-concentration region 21 in addition to the p⁺ type main junction region 12.

As described in the first to third preferred embodiments, the semiconductor layer 2 has a single-layer structure made of an n type FZ substrate. However, the semiconductor layer 2 may have a layered structure that includes a silicon-made semiconductor substrate and an n type silicon-made epitaxial layer. The epitaxial layer is formed on the semiconductor substrate.

In this case, the epitaxial layer serves as the n type impurity region 10. If an n type impurity region is formed at the surface layer portion of the second main surface 4 of the semiconductor layer 2, this n type impurity region may be formed by an n type semiconductor substrate. If a p type impurity region is formed at the surface layer portion of the second main surface 4 of the semiconductor layer 2, this p type impurity region may be formed by a p type semiconductor substrate.

This application corresponds to Japanese Patent Application No. 2017-092423 filed with the Japan Patent Office on May 8, 2017, and the entire disclosure of the application is incorporated herein by reference.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

REFERENCE SIGNS LIST

1 Semiconductor device
2 Semiconductor layer
6 Active region
7 Outer region
8 Functional device
10 N type impurity region
11 P⁻ type impurity region
12 P⁺ type main junction region
13 Field-limit-region group
14 P⁺ type field limit region
20 P⁻ type low concentration region
21 P⁻ type main junction low-concentration region
61 Semiconductor device
62 First region of field-limit-region group
63 Second region of field-limit-region group
71 Semiconductor device

The invention claimed is:

1. A semiconductor device comprising:
a semiconductor layer that has a main surface and that includes an active region;
a first-conductivity-type first impurity region formed at a surface layer portion of the main surface of the semiconductor layer;
a second-conductivity-type field limit region formed along a peripheral edge of the active region in a surface layer portion of the first impurity region; and
a second-conductivity-type low concentration region that has a second-conductivity-type impurity concentration lower than a second-conductivity-type impurity concentration of the field limit region and that is formed along a peripheral edge of the field limit region in a region on a side opposite to the active region with respect to the field limit region in the surface layer portion of the first impurity region, wherein a bottom portion of the low concentration region is formed in a region that is shallower than a bottom portion of the field limit region regarding a thickness direction of the semiconductor layer.

2. The semiconductor device according to claim 1, wherein the low concentration region is electrically connected to the field limit region.

3. The semiconductor device according to claim 1, wherein the field limit region surrounds the active region, and
the low concentration region surrounds the field limit region.

4. The semiconductor device according to claim 1, further comprising a field-limit-region group that has a plurality of the field limit regions formed with intervals along a direction away from the active region,
wherein at least one of the low concentration regions is formed with respect to at least one of the field limit regions.

5. The semiconductor device according to claim 4, wherein the field-limit-region group includes a first region that has one or more of the field limit regions formed in a region adjacent to the active region and a second region that has one or more of the field limit regions formed in a region on a side opposite to the active region with respect to the first region, and one or more of the low concentration regions are formed with respect to one or more of the field limit regions formed in the first region.

6. The semiconductor device according to claim 5, wherein one or more of the low concentration regions are formed with respect to one or more of the field limit regions formed in the second region.

7. The semiconductor device according to claim 6, wherein a second-conductivity-type impurity concentration of one or more of the low concentration regions formed in the second region is lower than a second-conductivity-type impurity concentration of one or more of the low concentration regions formed in the first region.

8. The semiconductor device according to claim 6, wherein, regarding a direction away from the active region, a width of one or more of the low concentration regions formed in the second region is a smaller than a width of one or more of the low concentration regions formed in the first region.

9. The semiconductor device according to claim 6, wherein, regarding a thickness direction of the semiconductor layer, a depth of one or more of the low concentration regions formed in the second region is smaller than a depth of one or more of the low concentration regions formed in the first region.

10. The semiconductor device according to claim 6, wherein a width of a depletion layer spreading from one or more of the low concentration regions formed in the second region is smaller than a width of a depletion layer spreading from one or more of the low concentration regions formed in the first region.

11. The semiconductor device according to claim 4, wherein a plurality of the low concentration regions are formed in one-to-one correspondence with respect to the field limit regions.

12. The semiconductor device according to claim 11, wherein the low concentration regions are formed such that a second-conductivity-type impurity concentration becomes gradually lower in proportion to a distance receding from the active region.

13. The semiconductor device according to claim 11, wherein the low concentration regions are formed such that the low concentration regions become gradually smaller in width in proportion to a distance receding from the active region.

14. The semiconductor device according to claim 11, wherein the low concentration regions are formed such that the low concentration regions become gradually smaller in depth in proportion to a distance receding from the active region.

15. The semiconductor device according to claim 11, wherein the low concentration regions are formed such that a width of a depletion layer becomes gradually smaller in proportion to a distance receding from the active region.

16. The semiconductor device according to claim 1, further comprising a second-conductivity-type main junction region formed in a region between the active region and the field limit region in the surface layer portion of the first impurity region.

17. The semiconductor device according to claim 16, further comprising a main junction low-concentration region that has a second-conductivity-type impurity concentration lower than a second-conductivity-type impurity concentration of the main junction region and that is formed in a region between the main junction region and the field limit region along a peripheral edge of the main junction region in the surface layer portion of the first impurity region.

18. The semiconductor device according to claim 17, wherein the main junction low-concentration region is electrically connected to the main junction region.

19. The semiconductor device according to claim 17, wherein the main junction low-concentration region is electrically connected to the field limit region.

20. The semiconductor device according to claim 17, wherein the main junction low-concentration region has a second-conductivity-type impurity concentration equal to the second-conductivity-type impurity concentration of the low concentration region.

21. A semiconductor device comprising:
- a semiconductor layer that has a main surface and that includes an active region;
- a first-conductivity-type first impurity region formed at a surface layer portion of the main surface of the semiconductor layer;
- a second-conductivity-type field limit region formed along a peripheral edge of the active region in a surface layer portion of the first impurity region;
- a second-conductivity-type low concentration region that has a second-conductivity-type impurity concentration lower than a second-conductivity-type impurity concentration of the field limit region and that is formed along a peripheral edge of the field limit region in a region on a side opposite to the active region with respect to the field limit region in the surface layer portion of the first impurity region;
- a field-limit-region group that has a plurality of the field limit regions formed with intervals along a direction away from the active region;
- wherein at least one of the low concentration regions is formed with respect to at least one of the field limit regions;
- wherein one or more of the low concentration regions are formed with respect to one or more of the field limit regions formed in the second region; and
- wherein a second-conductivity-type impurity concentration of one or more of the low concentration regions formed in the second region is lower than a second-conductivity-type impurity concentration of one or more of the low concentration regions formed in the first region.

22. A semiconductor device comprising:
- a semiconductor layer that has a main surface and that includes an active region;
- a first-conductivity-type first impurity region formed at a surface layer portion of the main surface of the semiconductor layer;
- a second-conductivity-type field limit region formed along a peripheral edge of the active region in a surface layer portion of the first impurity region;
- a second-conductivity-type low concentration region that has a second-conductivity-type impurity concentration lower than a second-conductivity-type impurity concentration of the field limit region and that is formed along a peripheral edge of the field limit region in a region on a side opposite to the active region with respect to the field limit region in the surface layer portion of the first impurity region;
- a field-limit-region group that has a plurality of the field limit regions formed with intervals along a direction away from the active region;
- wherein at least one of the low concentration regions is formed with respect to at least one of the field limit regions;
- wherein a plurality of the low concentration regions are formed in one-to-one correspondence with respect to the field limit regions; and
- wherein the low concentration regions are formed such that a second-conductivity-type impurity concentration becomes gradually lower in proportion to a distance receding from the active region.

* * * * *